(12) United States Patent
Kumada et al.

(10) Patent No.: US 11,145,724 B2
(45) Date of Patent: Oct. 12, 2021

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventors: Keishirou Kumada, Matsumoto (JP); Yuichi Hashizume, Matsumoto (JP); Yasuyuki Hoshi, Matsumoto (JP); Yoshihisa Suzuki, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 20 days.

(21) Appl. No.: 16/548,977

(22) Filed: Aug. 23, 2019

(65) Prior Publication Data
US 2019/0386106 A1 Dec. 19, 2019

Related U.S. Application Data

(63) Continuation of application No. PCT/JP2018/029195, filed on Aug. 3, 2018.

(30) Foreign Application Priority Data

Sep. 5, 2017 (JP) .............................. JP2017-170680

(51) Int. Cl.
*H01L 29/16* (2006.01)
*H01L 21/02* (2006.01)
(Continued)

(52) U.S. Cl.
CPC .... *H01L 29/1608* (2013.01); *H01L 21/02529* (2013.01); *H01L 21/76816* (2013.01); *H01L 29/401* (2013.01); *H01L 29/4236* (2013.01)

(58) Field of Classification Search
CPC ........... H01L 29/1608; H01L 21/02529; H01L 21/76816; H01L 29/401; H01L 29/4236
See application file for complete search history.

(56) References Cited

U.S. PATENT DOCUMENTS

| 2004/0021174 A1 | 2/2004 | Kobayashi |
| 2010/0155833 A1 | 6/2010 | Sumida et al. |
(Continued)

FOREIGN PATENT DOCUMENTS

| JP | 2003-318396 A | 11/2003 |
| JP | 2005-347300 A | 12/2005 |
(Continued)

*Primary Examiner* — Seahvosh Nikmanesh
(74) *Attorney, Agent, or Firm* — Rabin & Berdo, P.C.

(57) ABSTRACT

A silicon carbide semiconductor device includes a first semiconductor layer of a first conductivity type on a substrate of the first conductivity type, a second semiconductor layer of a second conductivity type on the first semiconductor layer, and a first semiconductor region of the first conductivity type. The semiconductor device further includes a gate electrode provided in a plurality of trenches via gate insulating films, a protruding portion disposed on the second semiconductor layer at a bridge area between two adjacent ones of the trenches in a direction orthogonal to the trenches, an interlayer insulating film provided on the gate electrode, and having contact holes that form a striped pattern, a first electrode on the interlayer insulating film and in the contact holes, a plating film provided in a plating area, and a solder on the plating film.

7 Claims, 19 Drawing Sheets

(51) Int. Cl.
  *H01L 21/768* (2006.01)
  *H01L 29/40* (2006.01)
  *H01L 29/423* (2006.01)

(56) References Cited

U.S. PATENT DOCUMENTS

2010/0264546 A1    10/2010  Torii et al.
2015/0295044 A1    10/2015  Takeda et al.
2016/0336402 A1    11/2016  Onishi
2017/0084699 A1*    3/2017  Hoshi ................. H01L 29/1608
2017/0111037 A1     4/2017  Shiigi et al.
2018/0240940 A1*    8/2018  Lee ........................ H01L 33/62

FOREIGN PATENT DOCUMENTS

| | | |
|---|---|---|
| JP | 2006-100530 A | 4/2006 |
| JP | 2008-235547 A | 10/2008 |
| JP | 2009-111188 A | 5/2009 |
| JP | 2009-152364 A | 7/2009 |
| JP | 2010-147219 A | 7/2010 |
| JP | 2015-146399 A | 8/2015 |
| JP | 2015-204375 A | 11/2015 |
| JP | 2017-059720 A | 3/2017 |
| JP | 2017-079324 A | 4/2017 |
| WO | 2015/040712 A1 | 3/2015 |

\* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This is a continuation application of International Application PCT/JP2018/029195 filed on Aug. 3, 2018 which claims priority from a Japanese Patent Application No. 2017-170680 filed on Sep. 5, 2017, the contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

There is a strong demand in the market for large-current, high-speed power semiconductor devices. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling production (manufacture) of a next-generation power semiconductor device having low ON voltage, high-speed characteristics, and high-temperature characteristics.

Silicon carbide is chemically a very stable semiconductor material, has a wide bandgap of 3 eV, and can be used very stably as a semiconductor material even at high temperatures. Further, silicon carbide has a critical field strength that is at least ten times greater than the critical field strength of silicon and therefore, is expected to be a semiconductor material capable of sufficiently reducing ON resistance. Such characteristics of silicon carbide are shared by other wide bandgap semiconductor materials that have a wider bandgap than that of silicon such as, for example, gallium nitride (GaN). Therefore, use of a wide bandgap semiconductor material enables semiconductor devices of higher voltages.

In such a high-voltage semiconductor device that uses silicon carbide, to the extent that occurring loss is reduced, a carrier frequency ten times that of a conventional semiconductor device that uses silicon may be applied in inverter applications. When a semiconductor device is used for high frequency applications, the temperature of the generated heat to which the chip is subjected increases, thereby affecting the reliability of the semiconductor device. In particular, when a bonding wire, as a wiring material that carries out electric potential of a front electrode, is bonded to a front electrode on a front surface side of a substrate, and the semiconductor device is used under a high temperature, for example, 200 degrees C. or higher, adhesion between the front electrode and the bonding wire decreases, whereby reliability is adversely affected.

There are instances where a silicon carbide semiconductor device is used under a high temperature of 230 degrees C. or higher and therefore, a pin electrode may be soldered to the front electrode instead of the bonding wire. As a result, decreases in the adhesion between the front electrode and the pin electrode may be prevented. FIG. 22 is a cross-sectional view of a structure of a conventional silicon carbide semiconductor device. As depicted in FIG. 22, a MOS gate that has a general trench gate structure is included on a front surface (surface on a side having a p-type silicon carbide epitaxial layer 103) side of a semiconductor base (hereinafter, silicon carbide base) that contains silicon carbide. The silicon carbide base (semiconductor chip) is formed by sequentially forming by epitaxial growth on an $n^+$-type support substrate (hereinafter, $n^+$-type silicon carbide substrate) 101 that contains silicon carbide, silicon carbide layers that constitute an n-type silicon carbide epitaxial layer 102, an n-type high-concentration layer 106 that is a current spreading layer, and the p-type silicon carbide epitaxial layer 103.

In the n-type high-concentration layer 106, a first $p^+$-type base region 104 is selectively provided between adjacent trenches 1018 (mesa portion). Further, in the n-type high-concentration layer 106, a second $p^+$-type base region 105 is selectively provided partially underlying a bottom of a trench 1018. The second $p^+$-type base region 105 is provided at a depth not reaching the n-type silicon carbide epitaxial layer 102. The second $p^+$-type base region 105 and the first $p^+$-type base region 104 may be formed concurrently. The first $p^+$-type base region 104 is provided so as to be in contact with the p-type silicon carbide epitaxial layer 103.

Reference numerals 107 to 1011, 1013, and 1015 are an $n^+$-type source region, a $p^{++}$-type contact region, a gate insulating film, a gate electrode, an interlayer insulating film, a source electrode, and a source electrode pad. A plating film 1016 is provided on the source electrode pad 1015. A pin electrode 1019 that is connected to a portion of the plating film 1016 via a solder 1017 is provided. A rear electrode 1014 is provided on a rear surface of the $n^+$-type silicon carbide substrate 101.

Further, as a technique of realizing high capability under conditions accompanying heating or cooling, a commonly known semiconductor device includes a surface electrode and a bonding layer partially formed on the surface electrode, and an end portion of the bonding layer is positioned in a region on the surface electrode (for example, refer to International Publication No. WO 2015/040712). Further, as a technique of suppressing destruction of an electrode portion by thermal stress, a commonly known semiconductor device has an electrode portion that is constituted by an Al electrode and an Ni-plated layer, and a length from an uppermost portion of an interlayer insulating film to a bottom of a recessed portion present at a surface of the Al electrode is set to be at least 1.8 μm (for example, refer to Japanese Laid-Open Patent Publication No. 2005-347300). Further, a required thin film thickness when a contact plug is formed and increases in contact resistance are suppressed is reduced and therefore, a commonly known semiconductor device includes an interlayer insulating film that has first portions that respectively underlie trench gates, and second portions that are between adjacent first portions and that are formed along a direction orthogonal to the first portions (for example, refer to Japanese Laid-Open Patent Publication No. 2015-146399).

SUMMARY OF THE INVENTION

According to an embodiment of the invention, a silicon carbide semiconductor device includes a semiconductor substrate of a first conductivity type; a first semiconductor layer of the first conductivity type provided on a front surface of the semiconductor substrate and having a first side, and a second side opposite to the first side and facing the front surface of the semiconductor substrate, the first semiconductor layer having an impurity concentration lower than an impurity concentration of the semiconductor substrate; a second semiconductor layer of a second conductivity type selectively provided at a surface of the first side of the first semiconductor layer, the second semiconductor layer having a first side, and a second side opposite to the first side and facing the first side of the first semiconductor layer; a first semiconductor region of the first conductivity type selectively provided in a surface layer of the first side of the second semiconductor layer; a gate electrode including a first portion provided in a plurality of trenches via gate insulating films, the trenches being provided at the first side of the second semiconductor layer; a protruding portion disposed, on the second semiconductor layer, in a bridge area located between two adjacent ones of the trenches in a direction orthogonal to the trenches; an interlayer insulating film provided on the gate electrode, and having a plurality of contact holes, the contact holes forming a striped pattern and each exposing a part of the second semiconductor layer and a part of the first semiconductor region; a first electrode provided on the interlayer insulating film and in the contact holes; a plating film provided in a plating area on the first electrode; a solder on the plating film; and a second electrode provided on a rear surface of the semiconductor substrate.

In the embodiment, the protruding portion includes a part of the interlayer insulating film disposed in the bridged area.

In the embodiment, the gate electrode includes a second portion disposed in the bridged area on the second semiconductor layer. The protruding portion includes the second portion of the gate electrode and a part of the interlayer insulating film disposed on the second portion of the gate electrode.

In the embodiment, the silicon carbide semiconductor device further includes a barrier metal provided between the interlayer insulating film and the first electrode. The protruding portion includes a part of the barrier metal disposed on the interlayer insulating film at the bridge area.

In the embodiment, an area on the interlayer insulating film corresponding to the plating area is free of the contact holes.

In the embodiment, the protruding portion includes a plurality of hexagonal shapes, as viewed from the front surface of the semiconductor substrate.

In the embodiment, the gate electrode has one striped shape in an area other than the plating area, and in the plating area, has either an other striped shape having stripes extending in a direction different from a direction of stripes of the one striped shape, or has a polygonal shape.

In the embodiment, each of the trenches penetrates the second semiconductor layer and reaches the first semiconductor layer.

According to another embodiment of the invention, a method of manufacturing a silicon carbide semiconductor device includes forming on a front surface of a semiconductor substrate of a first conductivity type, a first semiconductor layer of the first conductivity type and having a first side, and a second side opposite to the first side and facing the front surface of the semiconductor substrate, the first semiconductor layer having an impurity concentration lower than an impurity concentration of the semiconductor substrate; selectively forming a second semiconductor layer of a second conductivity type at a surface of a first side of the first semiconductor layer, the second semiconductor layer having a first side, and a second side opposite to the first side and facing the first side of the first semiconductor layer; selectively forming a first semiconductor region of the first conductivity type in a surface layer of a first side of the second semiconductor layer, the first side of the second semiconductor layer being opposite to a first side of the second semiconductor layer facing the first side of the first semiconductor layer; forming a gate electrode including a first portion in a plurality of trenches via gate insulating films at the first side of the second semiconductor layer; forming a protruding portion, on the second semiconductor layer, in a bridge area located between two adjacent ones of the trenches in a direction orthogonal to the trenches; forming an interlayer insulating film on the gate electrode, the interlayer insulating film including a plurality of contact holes forming a striped pattern and each exposing a part of the second semiconductor layer and a part of the first semiconductor region; forming a first electrode on the interlayer insulating film and in the contact holes; selectively forming a plating film at a plating area on the first electrode; providing a solder on the plating film; and forming a second electrode on a rear surface of the semiconductor substrate.

In the embodiment, the protruding portion includes a part of the interlayer insulating film disposed in the bridge area.

In the embodiment, forming a gate electrode includes forming the gate electrode including a second portion in the bridged area on the second semiconductor layer. The protruding portion includes the second portion of the gate electrode and a part of the interlayer insulating film disposed on the second portion of the gate electrode.

In the embodiment, the method further including forming a barrier metal between the interlayer insulating film and the first electrode. The protruding portion includes a part of the barrier metal disposed on the interlayer insulating film at the bridge area.

In the embodiment, an area of the interlayer insulating film corresponding to the plating area is free of the contact holes.

In the embodiment, forming the gate electrode includes forming the gate electrode in one striped shape in an area other than the plating area, and forming the gate electrode in the plating area either in an other striped shape having stripes extending in a direction different from a direction of stripes of the one striped shape, or in a polygonal shape.

Objects, features, and advantages of the present invention are specifically set forth in or will become apparent from the following detailed description of the invention when read in conjunction with the accompanying drawings.

DETAILED DESCRIPTION OF THE INVENTION

First, problems related to the conventional techniques will be described. In a case where the plating film 1016 and the solder 1017 are provided on the source electrode pad 1015, and the pin electrode is attached by the solder 1017 to enhance heat resistance, when continuous testing is performed, the solder 1017 is pushed out due to stress of the pin electrode. Meanwhile, in the conventional silicon carbide semiconductor device, a step is formed by the interlayer insulating film 1011, whereby a groove 10B is formed at a surface of the source electrode pad 1015 that is provided at a surface of the interlayer insulating film 1011.

Figure 23:
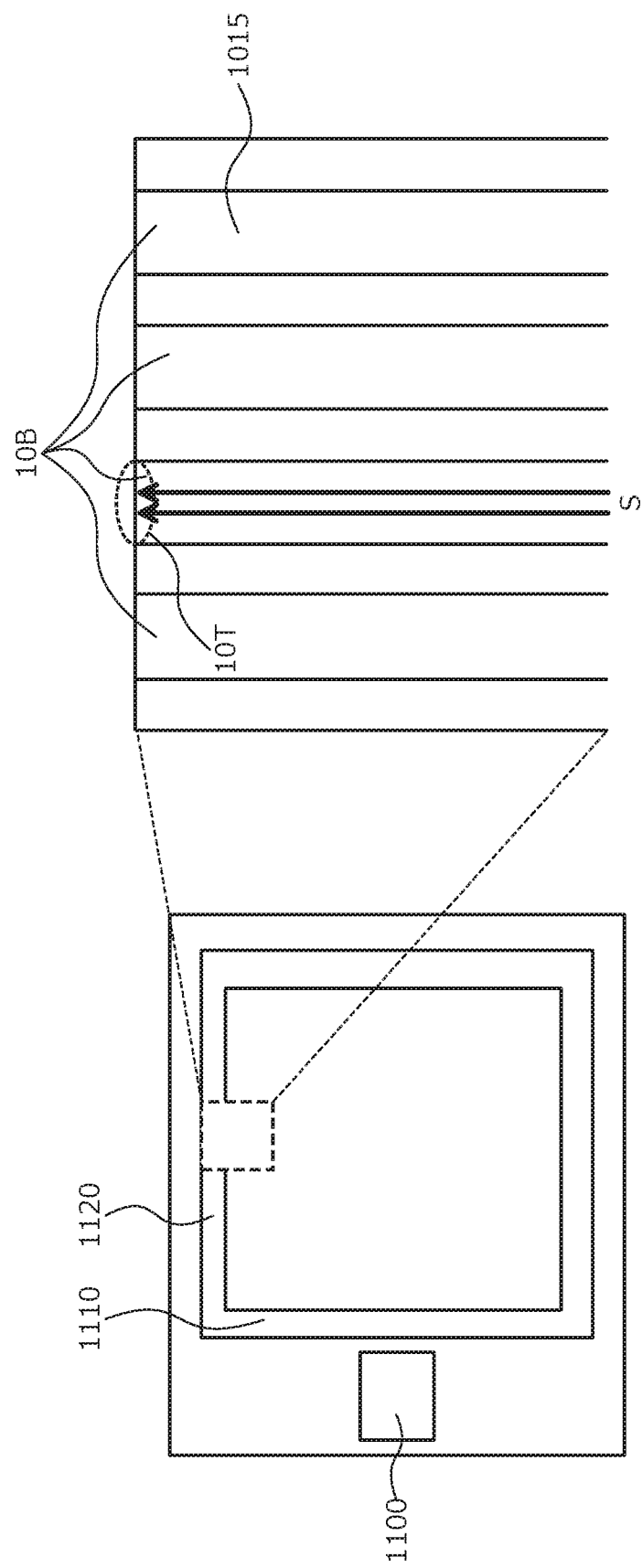
FIG. 23 is a top view of a structure of a portion of the conventional silicon carbide semiconductor device.

FIG. 23 is a top view of a structure of a portion of the conventional silicon carbide semiconductor device. As depicted in FIG. 23, the silicon carbide semiconductor device includes a gate pad region 1100, a source pad region 1110, and a plating region 1120. FIG. 23 further depicts an enlarged view of a portion surrounded by a dashed-lined square. In the conventional silicon carbide semiconductor device, when the solder 1017 is pushed by the stress of the pin electrode, since the groove 10B is present at the surface of the source electrode pad 1015, the solder 1017 advances along the groove 10B and is pushed to an end portion 10T of the groove 10B.

In the silicon carbide semiconductor device, while a polyimide is provided as a protective film 1020 on the source electrode 1013, the solder 1017 is further pushed into a gap between the polyimide and the source electrode 1013 by a force of the pushed solder 1017. Here, while the source electrode 1013 is formed of aluminum (Al), Al does not act as a barrier against the solder 1017 and thus, the solder 1017 reaches a surface of the silicon carbide base, whereby characteristics of the silicon carbide semiconductor device degrade. In some instances, the solder 1017 may further enter the interlayer insulating film 1011, whereby the source electrode 1013 and the gate electrode 1010 short, damaging the silicon carbide semiconductor device.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
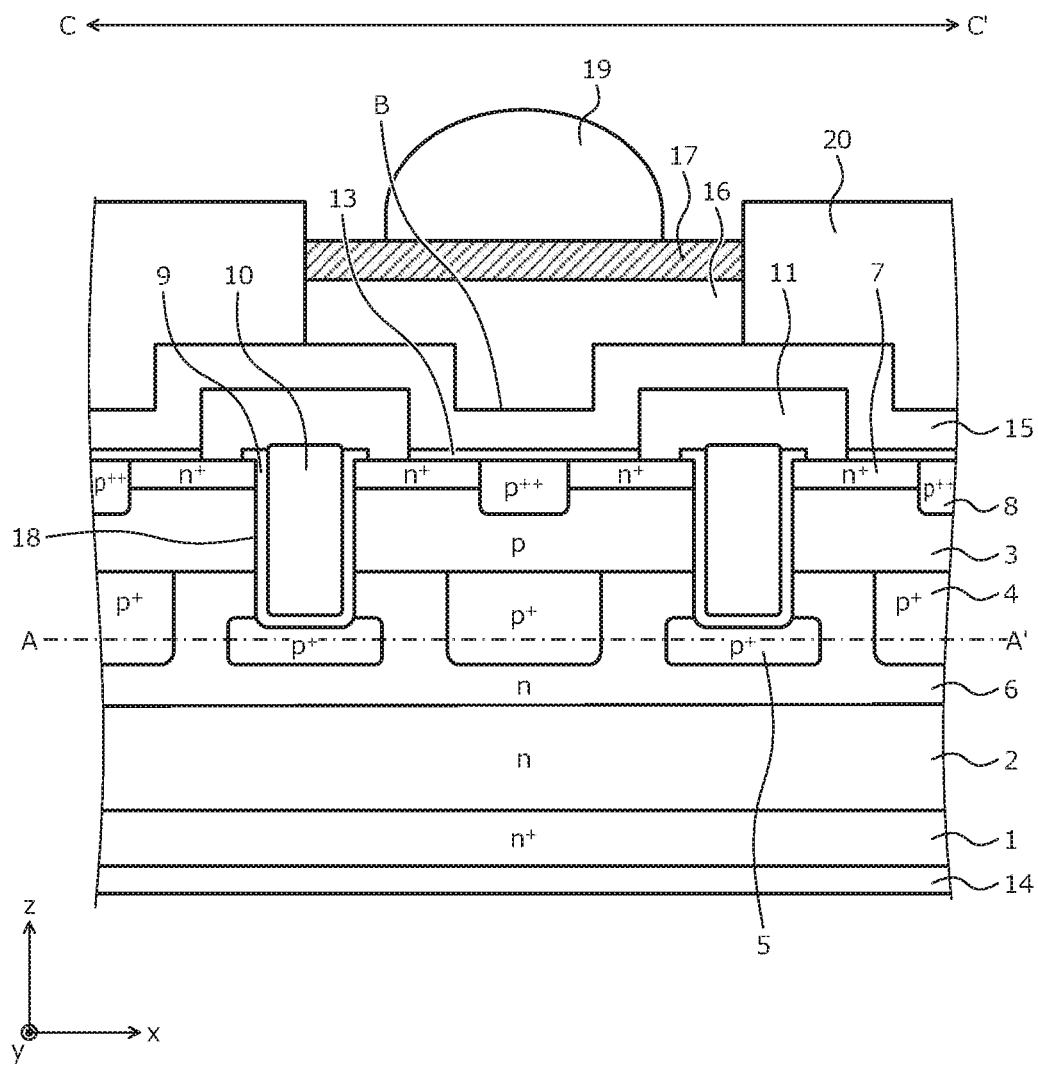
FIG. 1 is a cross-sectional view of a structure of a portion of a silicon carbide semiconductor device according to a first embodiment, along cutting line C-C' in FIGS. 3 and 4.
Figure 2:
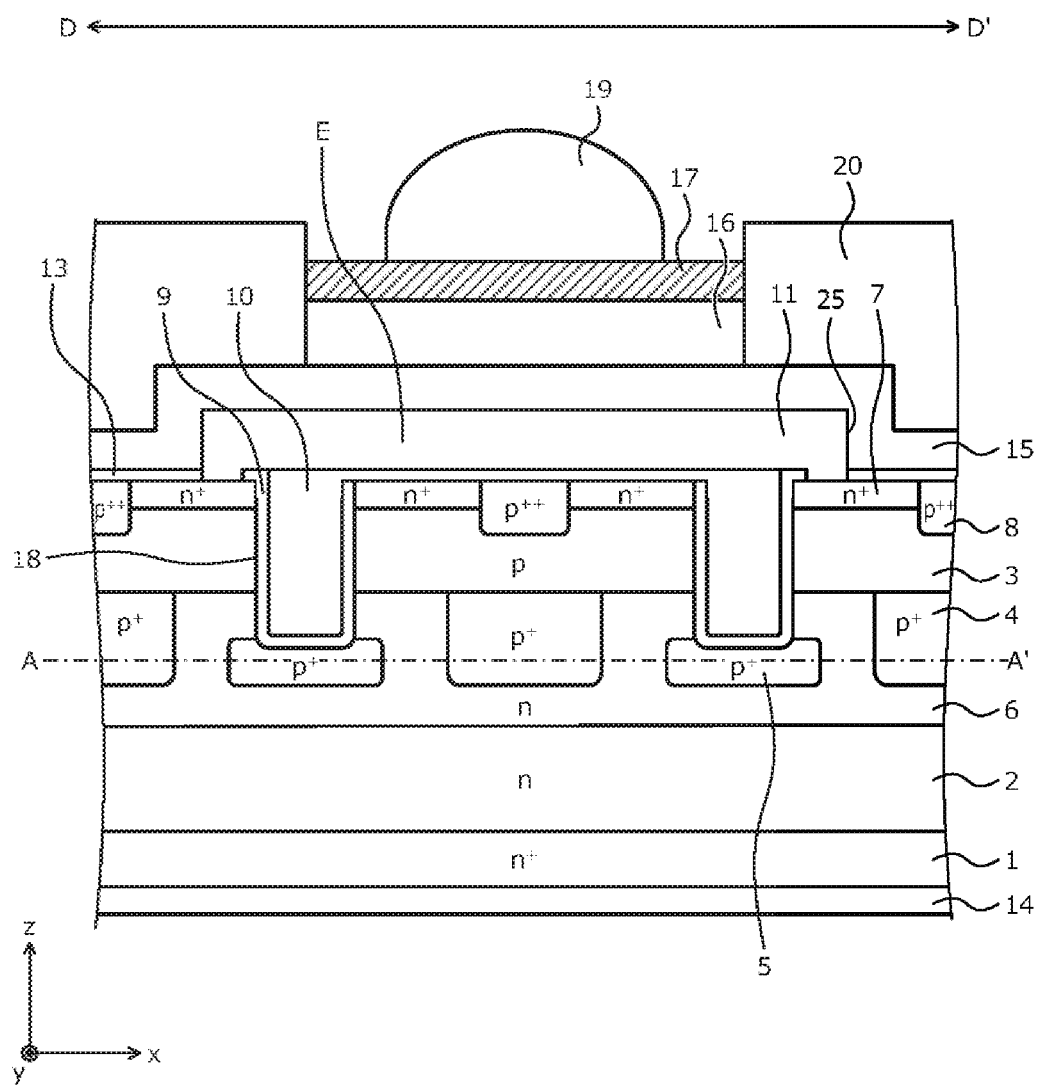
FIG. 2 is a cross-sectional view of a structure of a portion of the silicon carbide semiconductor device according to the first embodiment, along cutting line D-D' in FIGS. 3 and 4.

A semiconductor device according to an embodiment of the invention is configured using a wide bandgap semiconductor material. In a first embodiment, a silicon carbide semiconductor device fabricated using, for example, silicon carbide (SiC) as the wide bandgap semiconductor material will be described taking a MOSFET as an example. FIG. 1 is a cross-sectional view of a structure of a portion of the silicon carbide semiconductor device according to the first embodiment, along cutting line C-C' in FIGS. 3 and 4. FIG. 2 is a cross-sectional view of a structure of a portion of the silicon carbide semiconductor device according to the first embodiment, along cutting line D-D' in FIGS. 3 and 4.

As depicted in FIGS. 1 and 2, in the silicon carbide semiconductor device according to the first embodiment, an n-type silicon carbide epitaxial layer (first semiconductor layer of the first conductivity type) 2 is deposited on a first main surface (front surface), for example, a (0001) plane (Si-face), of an $n^+$-type silicon carbide substrate (semiconductor substrate of a first conductivity type) 1.

The $n^+$-type silicon carbide substrate 1 is a silicon carbide single crystal substrate that is doped with, for example, nitrogen (N). The n-type silicon carbide epitaxial layer 2 is a low-concentration n-type drift layer that is doped with, for example, nitrogen and that has an impurity concentration that is lower than an impurity concentration of the $n^+$-type silicon carbide substrate 1. An n-type high-concentration layer 6 is formed at a surface of the n-type silicon carbide epitaxial layer 2, the surface being on a first side of the n-type silicon carbide epitaxial layer 2, opposite a second side thereof that faces toward the $n^+$-type silicon carbide substrate 1. The n-type high-concentration layer 6 is a high-concentration n-type drift layer that is doped with, for example, nitrogen and that has an impurity concentration that is lower than the impurity concentration of the $n^+$-type silicon carbide substrate 1 and higher than the impurity concentration of the n-type silicon carbide epitaxial layer 2. Hereinafter, the $n^+$-type silicon carbide substrate 1, the n-type silicon carbide epitaxial layer 2, and a p-type silicon carbide epitaxial layer (second semiconductor layer of a second conductivity type) 3 described hereinafter collectively constitute a silicon carbide semiconductor base.

As depicted in FIGS. 1 and 2, a rear electrode (second electrode) 14 is provided on a second main surface (rear surface, i.e., rear surface of the silicon carbide semiconductor base) of the $n^+$-type silicon carbide substrate 1. The rear electrode 14 constitutes a drain electrode. A drain electrode pad (not depicted) is provided on a surface of the rear electrode 14.

In an upper portion of the silicon carbide semiconductor base (portion including the p-type silicon carbide epitaxial layer 3), a trench structure having a striped shape is formed. In particular, a trench 18 penetrates the p-type silicon carbide epitaxial layer 3 and reaches the n-type silicon carbide epitaxial layer 2, from a surface of the p-type silicon carbide epitaxial layer 3, the surface on a first side (first main surface side of the silicon carbide semiconductor base) of the p-type silicon carbide epitaxial layer 3, opposite a second side thereof that faces toward the $n^+$-type silicon carbide substrate 1. Along an inner wall of the trench 18, a gate insulating film 9 is formed on a bottom and side walls of the trench 18, and on the gate insulating film 9 in the trench 18, a gate electrode 10 having a striped shape is formed. The gate electrode 10 is insulated from the n-type silicon carbide epitaxial layer 2 and the p-type silicon carbide epitaxial layer 3 by the gate insulating film 9. A portion of the gate electrode 10 protrudes from a top (side nearest a source electrode pad 15) of the trench 18 toward the source electrode pad 15.

In a surface layer on the first side (the first main surface side of the silicon carbide semiconductor base) of the n-type silicon carbide epitaxial layer 2, a first $p^+$-type base region 4 and a second $p^+$-type base region 5 are selectively provided. The second $p^+$-type base region 5 is formed beneath the trench 18 and a width of the second $p^+$-type base region 5 may be wider than a width of the trench 18. The first $p^+$-type base region 4 and the second $p^+$-type base region 5 are doped with, for example, aluminum.

Figure 7:
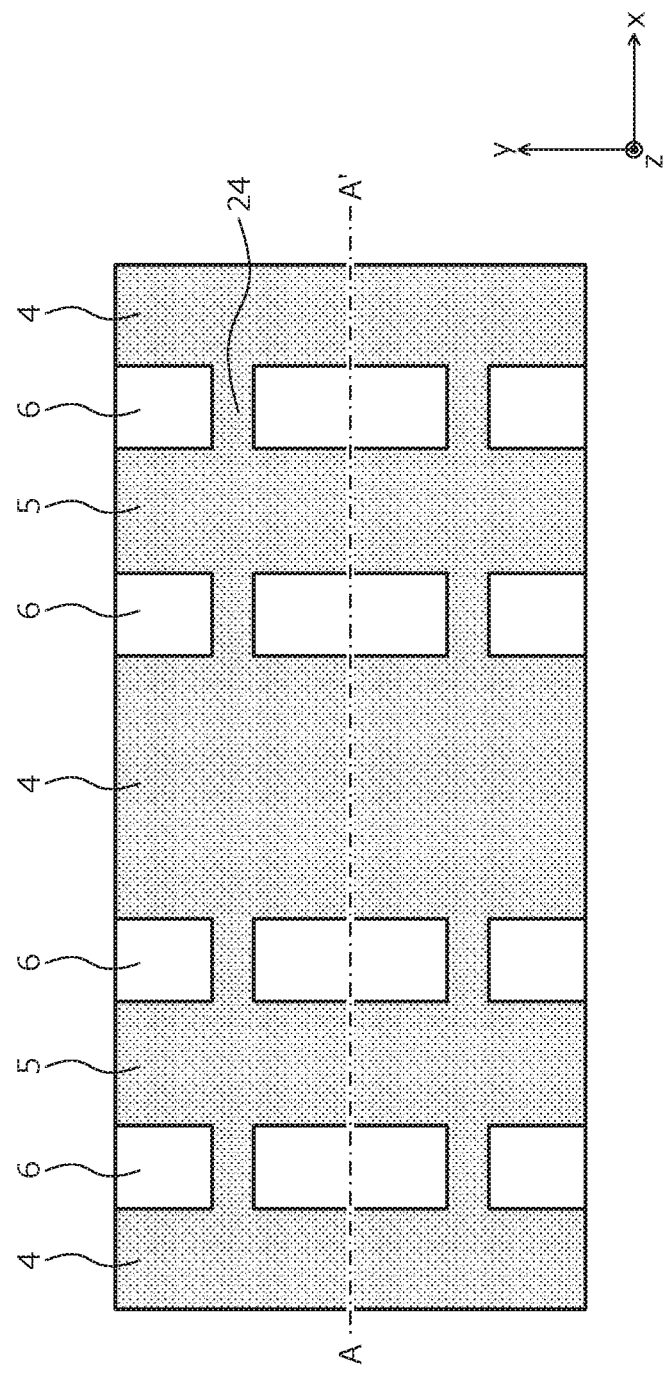
FIG. 7 is a plan view of a portion of the silicon carbide semiconductor device according to the first embodiment, along cutting line A-A' in FIG. 1.

A portion of the first $p^+$-type base region 4 may extend toward the trench 18 to thereby form a structure in which the first $p^+$-type base region 4 is connected to the second $p^+$-type base region 5. In this case, the first $p^+$-type base region 4 may have a planar layout in which portions of the first $p^+$-type base region 4 and the n-type high-concentration layer 6 repeatedly alternate along a direction (hereinafter, second direction) y that is orthogonal to a direction (hereinafter, first direction) x in which the first $p^+$-type base region 4 and the second $p^+$-type base region 5 are arranged. An example of a planar layout of the first and the second $p^+$-type base regions 4, 5 is depicted in FIG. 7. FIG. 7 is a plan view of a portion of the silicon carbide semiconductor device according to the first embodiment, along cutting line A-A' in FIG. 1.

In FIG. 7, a state in which the first and the second $p^+$-type base regions 4, 5 are connected by portions 24 of the first $p^+$-type base region 4 is depicted (hatched region). For example, as depicted in FIG. 7, a structure in which the portions 24 of the first $p^+$-type base region 4 extend along the first direction x toward the trench 18 on each side of the first $p^+$-type base region 4 so as to be connected with portions of the second $p^+$-type base region 5 may be periodically disposed along the second direction y. A reason for this is that holes that occur with avalanche breakdown at a junction portion between the second $p^+$-type base region 5 and the n-type silicon carbide epitaxial layer 2 are efficiently migrated to a source electrode (first electrode) 13, whereby load on the gate insulating film 9 is reduced, thereby increasing reliability.

On the first side of the n-type silicon carbide epitaxial layer 2, the p-type silicon carbide epitaxial layer 3 is provided. In the p-type silicon carbide epitaxial layer 3, an $n^+$-type source region (first semiconductor region of the first conductivity type) 7 and a $p^{++}$-type contact region 8 are selectively provided at a first side of the p-type silicon carbide epitaxial layer 3. The $n^+$-type source region 7 is in contact with the trench 18. Further, the $n^+$-type source region 7 and the $p^{++}$-type contact region 8 are in contact with each other. Further, the n-type high-concentration layer 6 is provided in portions of the surface layer on the first side of the n-type silicon carbide epitaxial layer 2, the portions between the first $p^+$-type base region 4 and the second $p^+$-type base region 5, and between the p-type silicon carbide epitaxial layer 3 and the second $p^+$-type base region 5.

In FIGS. 1 and 2, while only two trench MOS structures are depicted, numerous MOS gate (insulated gate constituted by a metal, an oxide film, and a semiconductor material) structures having the trench structure may be further disposed. Further, the $p^{++}$-type contact region 8 may be omitted.

An interlayer insulating film 11 is provided on the first main surface side of the silicon carbide semiconductor base overall so as to cover the gate electrode 10 embedded in each of the trenches 18. The source electrode 13 is in contact with the $n^+$-type source region 7 and the $p^{++}$-type contact region 8 via a contact hole opened in the interlayer insulating film 11. The contact hole opened in the interlayer insulating film 11 has a striped shape corresponding to the shape of the gate electrode 10. The source electrode 13 is electrically insulated from the gate electrode 10 by the interlayer insulating film 11. The source electrode pad 15 is provided on the source electrode 13. Between the source electrode 13 and the interlayer insulating film 11, for example, a barrier metal (not depicted) may be provided that prevents diffusion of metal atoms from the source electrode 13 toward the gate electrode 10.

On a top of the source electrode pad 15, a plating film 16 is selectively provided, and a solder 17 is selectively provided on a surface side of the plating film 16. In the solder 17, a pin electrode 19 that is a wiring material that carries electric potential of the source electrode 13 out to an external destination is provided. The pin electrode has a pin-like shape and is bonded in an upright state to the source electrode pad 15. Further, the protective film 20 is provided on the top of the source electrode pad 15 where the plating film 16 is not provided.

In the silicon carbide semiconductor device of the first embodiment, as depicted in FIG. 2, the gate electrode 10 has a portion E that extends along a direction (width direction of the trench 18) that is orthogonal to the striped shape thereof, whereby the gate electrode 10 is connected to the gate electrode 10 of another trench 18 by the portion E. The striped shape of the gate electrode 10 and that of the contact hole are substantially parallel and therefore, the portion E corresponds to a protruding portion that extends in a direction that is orthogonal to the striped shape of the contact hole. Further, the portion E is provided in a region that opposes the source electrode 13 where the solder 17 and the plating film 16 are provided.

Figure 3:
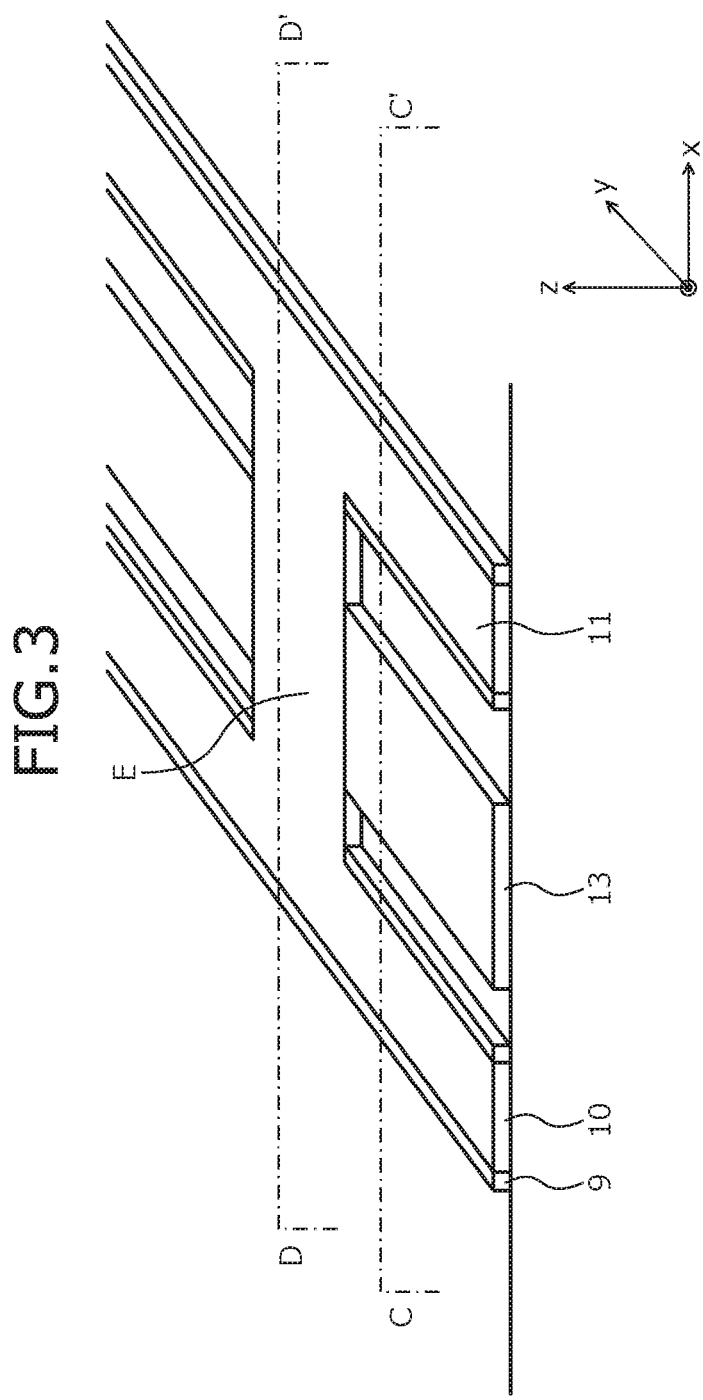
FIG. 3 is a perspective view of a portion of a structure of the silicon carbide semiconductor device according to the first embodiment.

FIG. 1 is a cross-sectional view of a portion that does not have the portion E that extends in the direction that is orthogonal to the striped shape of the gate electrode 10. FIG. 2 is a cross-sectional view of a portion that has the portion E that extends in the direction that is orthogonal to the striped shape of the gate electrode 10. Further, FIG. 3 is a perspective view of a portion of a structure of the silicon carbide semiconductor device according to the first embodiment. FIG. 3 depicts a portion of the structure of the silicon carbide semiconductor device before the interlayer insulating film 11 is formed. As depicted in FIG. 3, in the region where the portion E of the gate electrode 10 is provided, the source electrode 13 is not provided. Therefore, the interlayer insulating film 11 does not have to be removed to electrically connect the source electrode 13 and the source electrode pad 15.

Thus, as depicted in FIG. 2, in the region where the portion E of the gate electrode 10 is provided, a thickness of the interlayer insulating film 11 provided on the gate electrodes 10 is uniform. As a result, in the region where the portion E of the gate electrode 10 is provided, a structure is created in which a groove B of the top of the source electrode pad 15 is filled.

Figure 4:
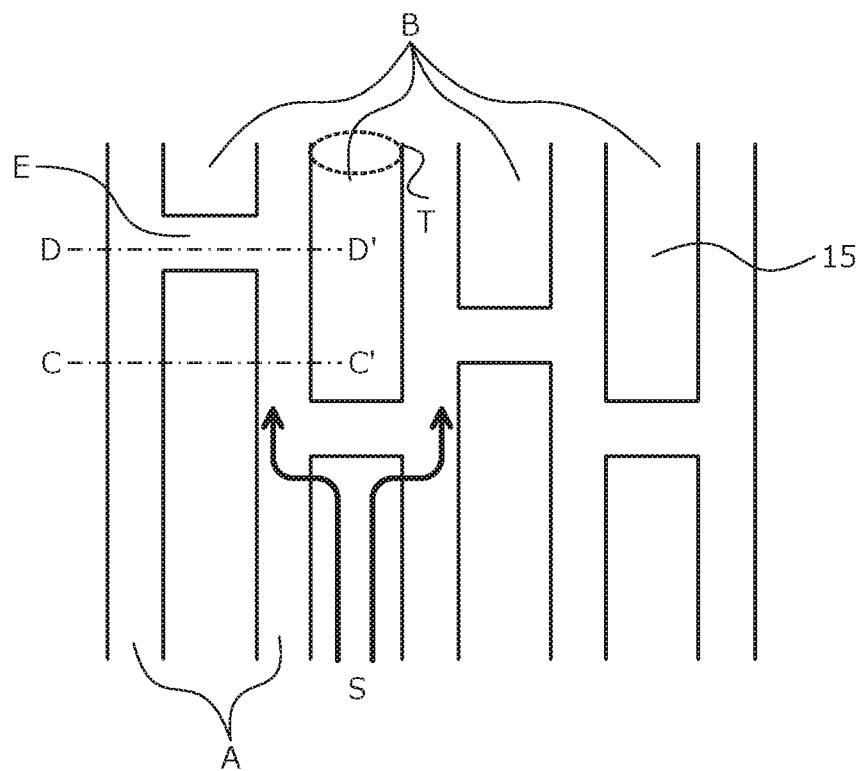
FIG. 4 is a top view of a structure of the silicon carbide semiconductor device according to the first embodiment.

FIG. 4 is a top view of a structure of the silicon carbide semiconductor device according to the first embodiment. As depicted in FIG. 4, at least one extended portion E of the gate electrode 10 is provided in the grooves B and the extended portion E may be provided in plural. Since the grooves B are filled at locations where the portion E is provided, the solder 17 is inhibited from flowing along the grooves B on the top of the source electrode pad 15. For example, the solder 17 that flows along the grooves B encounters the location where the portion E is provided and as indicated by arrow S in FIG. 4, changes direction, whereby the flow thereof is distributed. Although the solder 17 flowed in the groove B up to now, as depicted in FIG. 4, the solder 17 flows not only in the grooves B but also in a protruding portion A of the top of the source electrode pad 15, whereby the flow of the solder 17 is distributed. Distribution of the flow decreases the amount of the solder 17 that reaches the end portion T of the groove B, thereby reducing a pushing force of the solder 17, whereby the solder 17 may be prevented from entering an interior of the silicon carbide semiconductor device.

Figure 5:
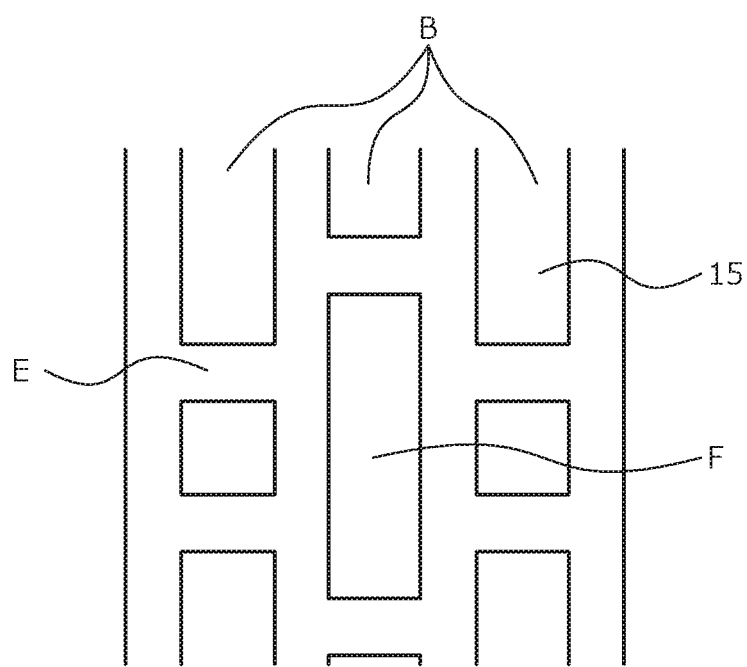
FIG. 5 is a top view of another structure of the silicon carbide semiconductor device according to the first embodiment.
Figure 6:
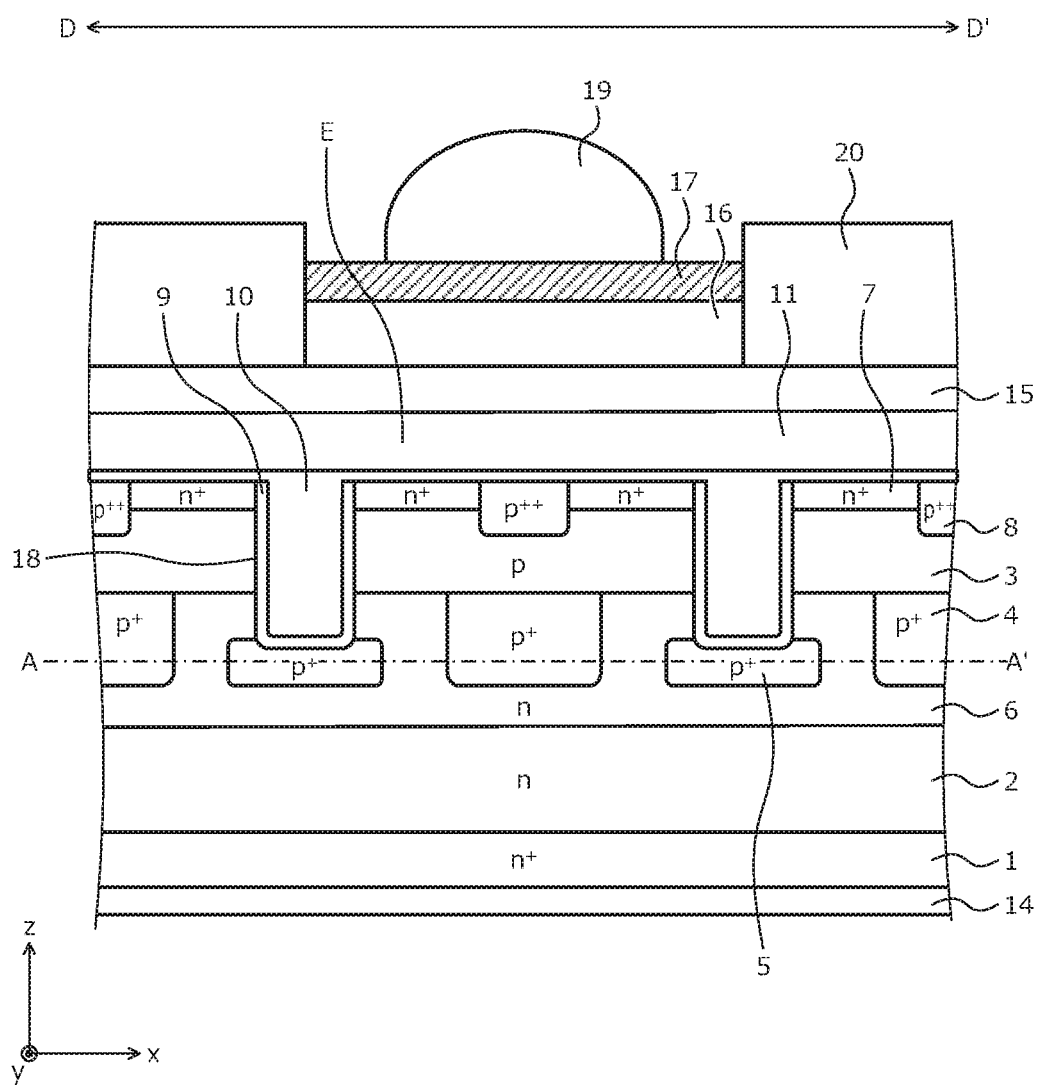
FIG. 6 is a cross-sectional view of another structure of the portion of the silicon carbide semiconductor device according to the first embodiment, along cutting line D-D' in FIGS. 3 and 4.

Here, the portion E is disposed in plural and provided that the flow of the solder 17 is distributed, disposal positions may be at regular intervals or irregular intervals. For example, the portion E may be disposed forming a ladder shape, a cross-coupling shape, a quadrangle, etc. However, for efficient distribution of the flow of the solder 17, the solder 17 may be caused to flow in a radiating shape. Therefore, the portion E may be disposed to form a hexagonal shape (layout) as viewed from above. FIG. 5 is a top view of another structure of the silicon carbide semiconductor device according to the first embodiment. FIG. 5 is an example of disposal of the portion E forming a hexagonal shape. The portion E may be further disposed at a position at a center F of the hexagonal shape. Further, the portion E may be set as the overall contact hole of a region in which the plating film 16 is provided. In other words, in the regions where the plating film 16 is provided, the contact hole is not provided in the interlayer insulating film 11 (refer to FIG. 6). (FIG. 6 is a cross-sectional view of another structure of the portion of the silicon carbide semiconductor device according to the first embodiment, along cutting line D-D' in FIGS. 3 and 4.) Since the gate electrodes 10 have a striped shape, the source electrode pad 15 is electrically connected to the $n^+$-type source regions 7 and the $p^{++}$-type contact regions 8 via the contact holes 25 provided in the regions in which the plating film 16 is not provided.

A method of manufacturing the silicon carbide semiconductor device according to the first embodiment will be described. FIGS. 8, 9, 10, 11, 12 13, and 14 are cross-sectional views of the silicon carbide semiconductor device according to the first embodiment during manufacture.

Figure 8:
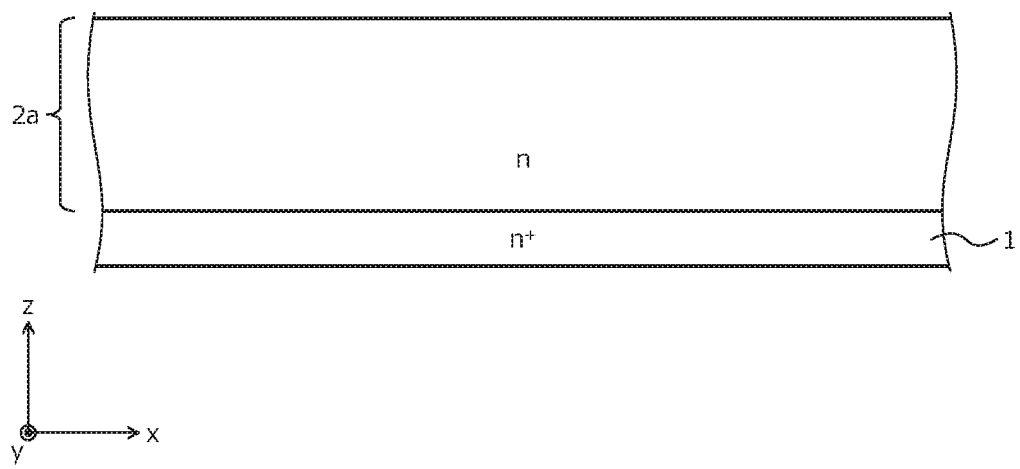
FIG. 8 is a cross-sectional view of the silicon carbide semiconductor device according to the first embodiment during manufacture.

First, the $n^+$-type silicon carbide substrate 1 of an n-type and containing silicon carbide is prepared. Subsequently, on the first main surface of the $n^+$-type silicon carbide substrate 1, a first n-type silicon carbide epitaxial layer 2a containing silicon carbide and having a thickness of, for example, about 30 μm is formed by epitaxial growth while an n-type impurity, for example, nitrogen atoms, is doped. The first n-type silicon carbide epitaxial layer 2a constitutes the n-type silicon carbide epitaxial layer 2. The state up to here is depicted in FIG. 8.

Figure 9:
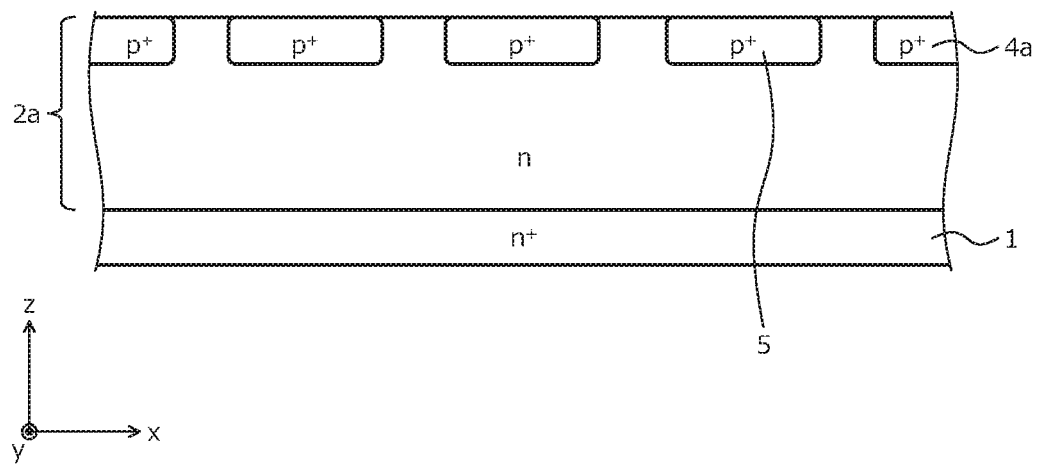
FIG. 9 is a cross-sectional view of the silicon carbide semiconductor device according to the first embodiment during manufacture.

Next, on the surface of the first n-type silicon carbide epitaxial layer 2a, an ion implantation mask having predetermined openings formed by a photolithography technique is formed using, for example, an oxide film. Subsequently, a p-type impurity such as aluminum is implanted in the openings of the oxide film whereby lower first p+-type base regions 4a are formed having a depth of about 0.5 μm. The second $p^+$-type base regions 5 that constitute the bottom of the trenches 18 may be formed concurrently with the lower first p+-type base region 4a. Formation is such that a distance between the second $p^+$-type base region 5 and the lower first p+-type base region 4a that is adjacent thereto is about 1.5 μm. An impurity concentration of the lower first p+-type base region 4a and the second $p^+$-type base region 5 is set to be, for example, about $5\times10^{18}/cm^3$. The state up to here is depicted in FIG. 9.

Next, portions of the ion implantation mask are removed and an n-type impurity such as nitrogen is ion implanted in the openings, thereby forming a lower n-type high-concentration layer 6a having a depth of, for example, about 0.5 μm in a portion of a surface region of the first n-type silicon carbide epitaxial layer 2a. An impurity concentration of the lower n-type high-concentration layer 6a is set to be, for example, about $1\times10^{17}/cm^3$.

Next, on the surface of the first n-type silicon carbide epitaxial layer 2a, a second n-type silicon carbide epitaxial layer 2b that is doped with an n-type impurity such as nitrogen is formed to have a thickness of about 0.5 μm. An impurity concentration of the second n-type silicon carbide epitaxial layer 2b is set to become about $3\times10^{15}/cm^3$. Hereinafter, the first n-type silicon carbide epitaxial layer 2a and the second n-type silicon carbide epitaxial layer 2b collectively constitute the n-type silicon carbide epitaxial layer 2.

Next, on the surface of the second n-type silicon carbide epitaxial layer 2b, an ion implantation mask having predetermined openings that are formed by photolithography is formed using, for example, an oxide film. Subsequently, a p-type impurity such as aluminum is implanted in the openings of the oxide film so as to form upper first $p^+$-type base regions 4b to respectively overlap the lower first p+-type base regions 4a and have a depth of about 0.5 μm. Thus, the lower first p+-type base regions 4a are respectively connected with the upper first $p^+$-type base regions 4b, thereby forming regions that constitute the first $p^+$-type base regions 4. An impurity concentration of the upper first $p^+$-type base regions 4b may be set to become, for example, about $5\times10^{18}/cm^3$.

Figure 10:
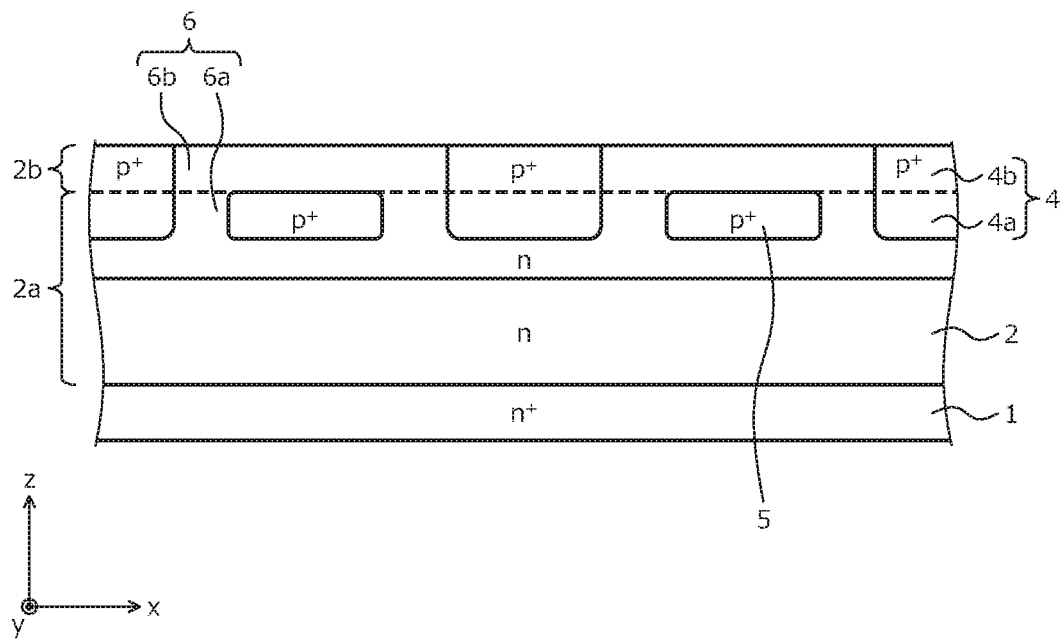
FIG. 10 is a cross-sectional view of the silicon carbide semiconductor device according to the first embodiment during manufacture.

Next, portions of the ion implantation mask are removed and an n-type impurity such as nitrogen is ion implanted in the openings, whereby an upper n-type high-concentration layer 6b having a depth of, for example, about 0.5 μm is provided in portions of a surface region of the second n-type silicon carbide epitaxial layer 2b. An impurity concentration of the upper n-type high-concentration layer 6b is set to be, for example, about $\times10^{17}/cm^3$. The upper n-type high-concentration layer 6b and the lower n-type high-concentration layer 6a are formed so as to be at least partially in contact with each other, whereby the n-type high-concentration layer 6 is formed. However, in some instances, the n-type high-concentration layer 6 may be formed on the substrate overall or may be omitted. The state up to here is depicted in FIG. 10.

Figure 11:
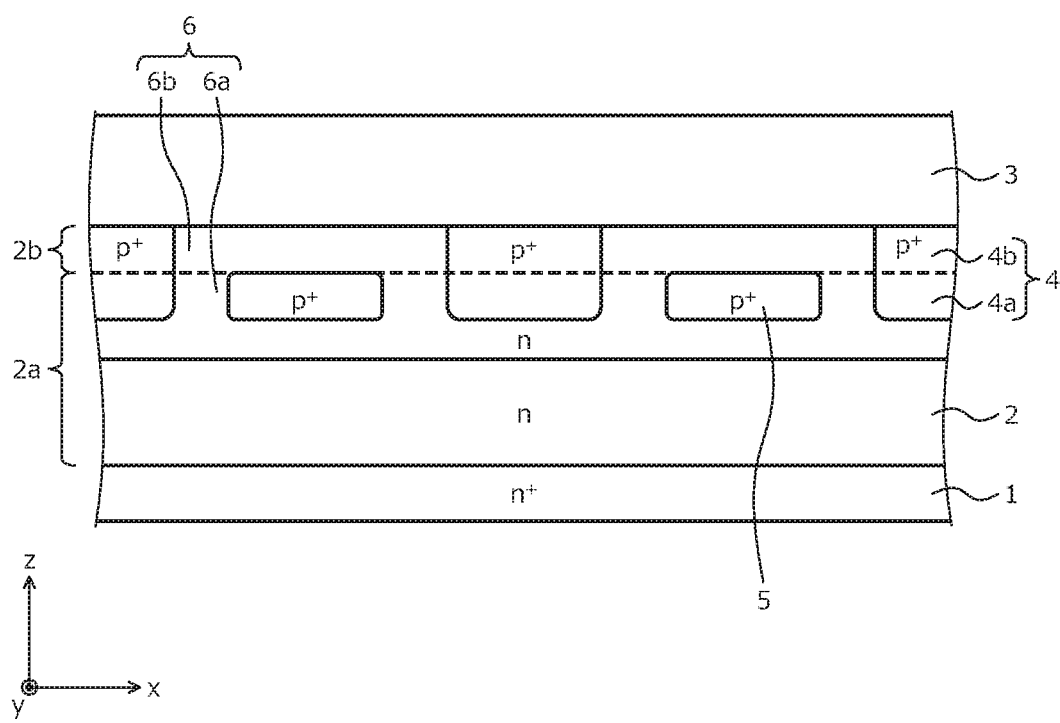
FIG. 11 is a cross-sectional view of the silicon carbide semiconductor device according to the first embodiment during manufacture.

Next, on the surface of the n-type silicon carbide epitaxial layer 2, the p-type silicon carbide epitaxial layer 3 doped with a p-type impurity such as aluminum is formed to have a thickness of about 1.3 μm. An impurity concentration of the p-type silicon carbide epitaxial layer 3 is set to be about $4\times10^{17}/cm^3$. The state up to here is depicted in FIG. 11.

Figure 12:
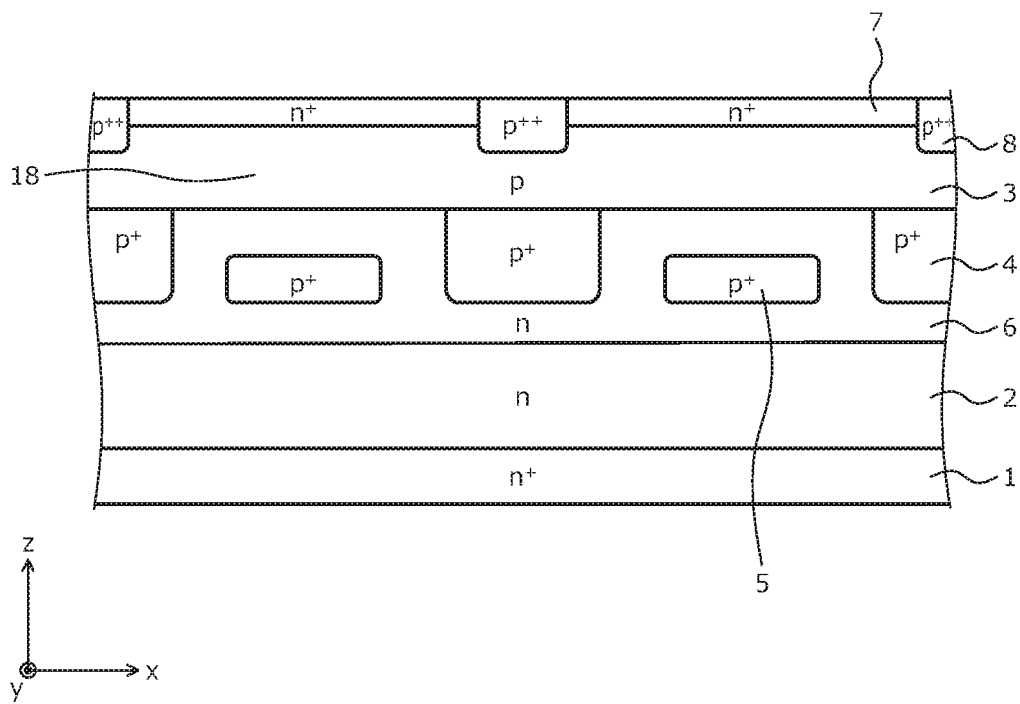
FIG. 12 is a cross-sectional view of the silicon carbide semiconductor device according to the first embodiment during manufacture.

Next, on the surface of the p-type silicon carbide epitaxial layer 3, an ion implantation mask having predetermined openings formed by photolithography is formed using, for example, an oxide film. An n-type impurity such as phosphorus (P) is ion implanted in the openings, thereby forming the $n^+$-type source region 7 at portions of the surface of the p-type silicon carbide epitaxial layer 3. An impurity concentration of the $n^+$-type source region 7 is set to become higher than the impurity concentration of the p-type silicon carbide epitaxial layer 3. Next, the ion implantation mask used in the formation of the $n^+$-type source region 7 is removed, and by the same method, an ion implantation mask having predetermined openings is formed and a p-type impurity such as aluminum is ion implanted at portions of the surface of the p-type silicon carbide epitaxial layer 3, thereby forming the $p^{++}$-type contact regions 8. An impurity concentration of the $p^{++}$-type contact regions 8 is set to become higher than the impurity concentration of the p-type silicon carbide epitaxial layer 3. The state up to here is depicted in FIG. 12.

Next, a heat treatment (annealing) is performed under an inert gas atmosphere of a temperature of about 1700 degrees C. and thus, an activation process for the first $p^+$-type base regions 4, the second $p^+$-type base regions 5, the $n^+$-type source regions 7, and the $p^{++}$-type contact regions 8 is carried out. As described, the ion implanted region may be collectively activated by a single session of a heat treatment, or may be activated by performing a session of the heat treatment with each ion implantation.

Figure 13:
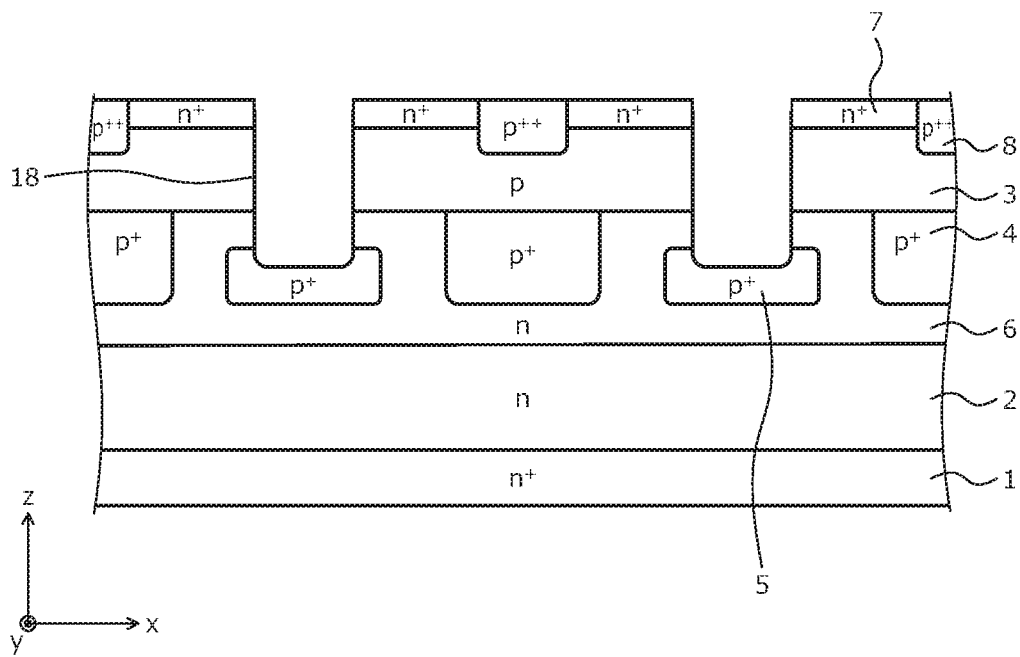
FIG. 13 is a cross-sectional view of the silicon carbide semiconductor device according to the first embodiment during manufacture.

Next, on the surface of the p-type silicon carbide epitaxial layer 3, a trench formation mask having predetermined openings formed by photolithography is formed using, for example, an oxide film. Next, by dry etching, the trenches 18 are formed to penetrate the p-type silicon carbide epitaxial layer 3 and reach the n-type silicon carbide epitaxial layer 2. The bottom of each trench 18 may reach the second $p^+$-type base regions 5 formed in the n-type silicon carbide epitaxial layer 2. Next, the trench formation mask is removed. The state up to here is depicted in FIG. 13.

Next, the gate insulating film 9 is formed along the surfaces of the $n^+$-type source regions 7 and the $p^{++}$-type contact regions 8 and along the bottom and side walls of each trench 18. The gate insulating film 9 may be formed by thermal oxidation by a heat treatment of a temperature of about 1000 degrees C. under an oxygen atmosphere. Further, the gate insulating film 9 may be formed by a deposition method by a chemical reaction such as for a high temperature oxide (HTO).

Next, on the gate insulating film 9, a polycrystalline silicon layer doped with, for example, phosphorus atoms is provided. The polycrystalline silicon layer may be formed so as to be embedded in the trenches 18. The polycrystalline silicon layer is patterned by photolithography to remain in the trenches 18, thereby forming the gate electrodes 10. In this patterning, formation is such that in regions that oppose the source electrode pad 15 where the solder 17 and the plating films 16 are provided, the gate electrodes 10 extend in the direction that is orthogonal to the striped shape thereof so as to be connected to each other.

Figure 14:
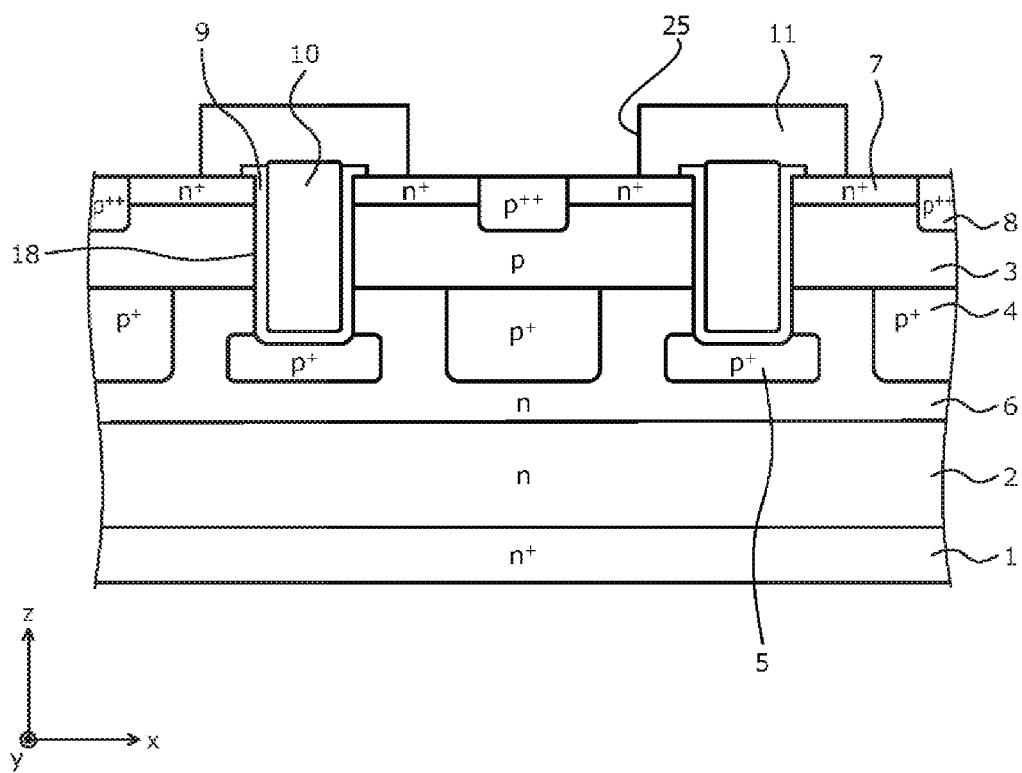
FIG. 14 is a cross-sectional view of the silicon carbide semiconductor device according to the first embodiment during manufacture.

Next, for example, phosphate glass is deposited so as to have a thickness of about 1 μm and to cover the gate insulating film 9 and the gate electrodes 10, thereby forming the interlayer insulating film 11. Next, a barrier metal (not depicted) containing titanium (Ti) or titanium nitride (TiN) may be formed so as to cover the interlayer insulating film 11. The interlayer insulating film 11 and the gate insulating film 9 are patterned by photolithography, thereby forming contact holes 25 that expose the $n^+$-type source regions 7 and the $p^{++}$-type contact regions 8. Thereafter, a heat treatment (reflow) is performed, thereby planarizing the interlayer insulating film 11. The state up to here is depicted in FIG. 14. In FIG. 14, the state of a structure of a portion along cutting line C-C' in FIG. 3 is depicted.

Next, in the contact holes 25 and on the interlayer insulating film 11, a conductive film containing nickel (Ni) or the like and constituting the source electrode 13 is provided. The conductive film is patterned by photolithography so that the source electrode 13 remains only in the contact holes 25.

Next, on the second main surface of the $n^+$-type silicon carbide semiconductor substrate 1, the rear electrode 14 containing nickel or the like is provided. Thereafter, a heat treatment is performed at a temperature of about 1000 degrees C. in an inert gas atmosphere, thereby forming the rear electrode 14 and the source electrode 13 that forms an ohmic junction with the n+-type source region 7, the p++-type contact region 8, and the n+-type silicon carbide semiconductor substrate 1.

Next, on the first main surface of the n+-type silicon carbide semiconductor substrate 1, an aluminum film having a thickness of about 5 μm is deposited by a sputtering method and removed by photolithography so as to cover the source electrode 13 and the interlayer insulating film 11, thereby forming the source electrode pad 15.

Next, on the surface of the rear electrode 14, for example, titanium (Ti), nickel, and gold (Au) are sequentially stacked, thereby forming the drain electrode pad (not depicted). Next, after regions of the source electrode pad 15 where the plating film 16 is not to be formed on the top of the source electrode pad 15 are covered by the protective film 20, the plating film 16 is formed on the top of the source electrode pad 15. Thereafter, the pin electrodes 19 are formed at the plating films 16 via the solder 17. Thus, as described, the silicon carbide semiconductor device depicted in FIGS. 1 and 2 is completed.

As described, according to the silicon carbide semiconductor device of the first embodiment, the gate electrodes have a protruding portion (E) that extends along the direction that is orthogonal to the striped shape of the contact holes 25. Grooves are filled in the top of the source electrode pad and the solder is prevented from flowing along the grooves of the top of the source electrode pad by this portion. As a result, the amount of solder that reaches the end portion of the grooves decreases, thereby reducing the pushing force of the solder, whereby the solder may be prevented from entering the interior of the silicon carbide semiconductor device. Therefore, characteristics of the silicon carbide semiconductor device do not degrade and the reliability of the silicon carbide semiconductor device does not decrease.

Figure 15:
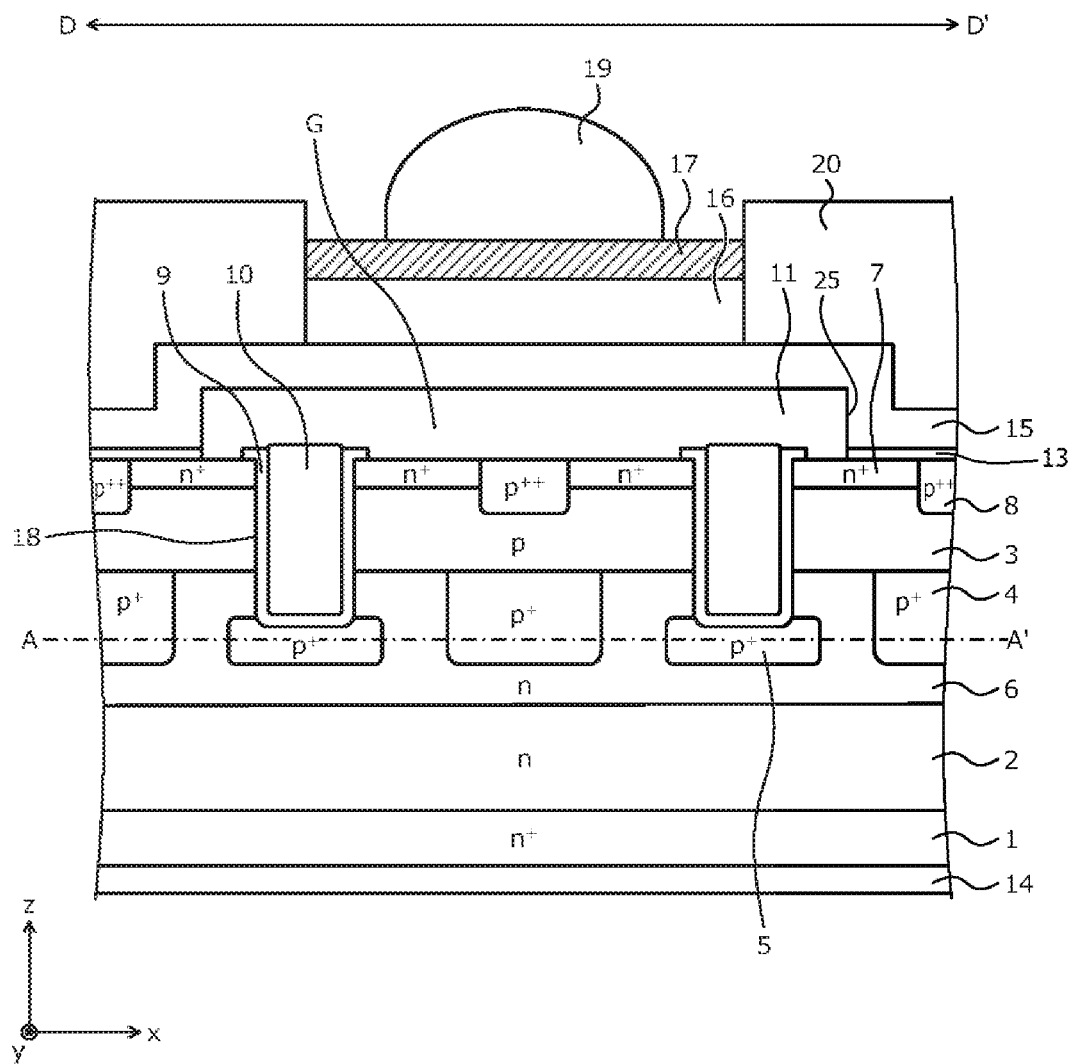
FIG. 15 is a cross-sectional view of a structure of a portion of the silicon carbide semiconductor device according to a second embodiment, along cutting line D-D' in FIG. 16.
Figure 16:
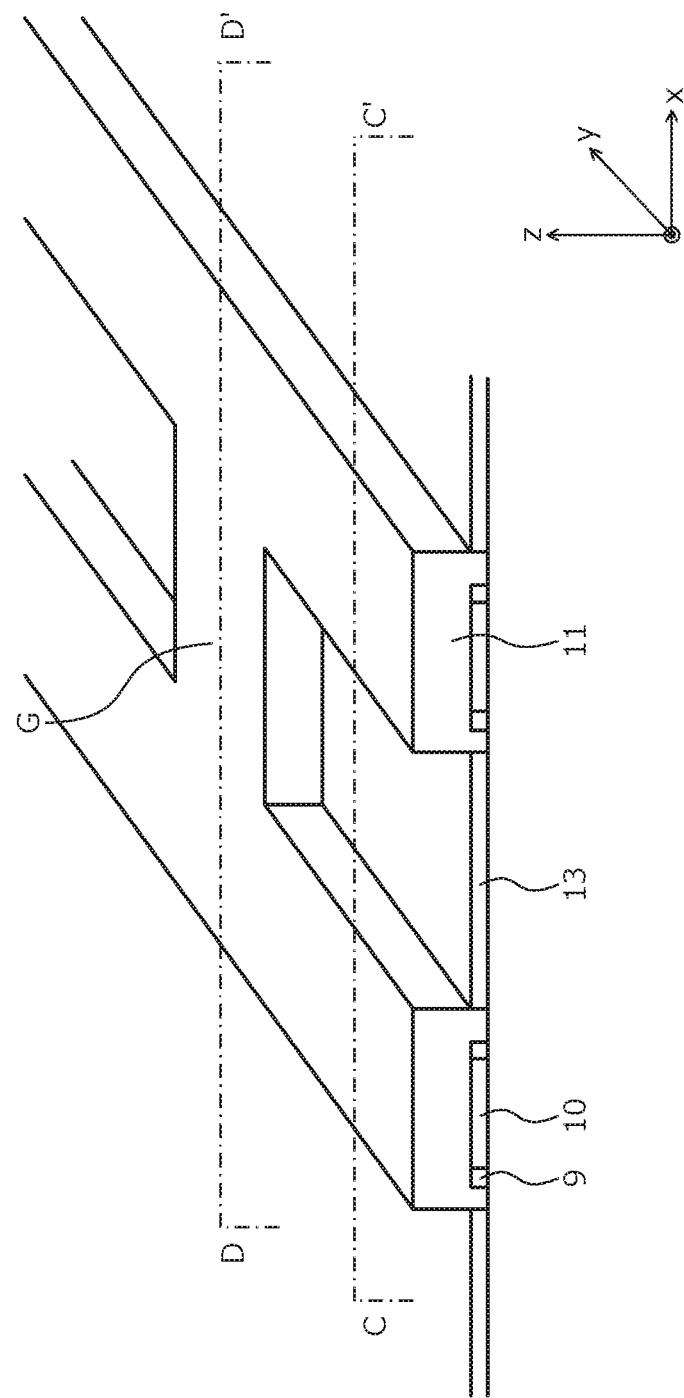
FIG. 16 is a perspective view of a portion of a structure of the silicon carbide semiconductor device according to the second embodiment.

FIG. 15 is a cross-sectional view of a structure of a portion of the silicon carbide semiconductor device according to a second embodiment, along cutting line D-D' in FIG. 16. FIG. 16 is a perspective view of a portion of a structure of the silicon carbide semiconductor device according to the second embodiment. A structure of a portion along cutting line C-C' in FIG. 16 is identical to that of the first embodiment depicted in FIG. 1 and thus, description is omitted hereinafter.

The silicon carbide semiconductor device according to the second embodiment differs from the silicon carbide semiconductor device according to the first embodiment in that instead of the gate electrode 10, the interlayer insulating film 11 has a portion G that extends along the direction that is orthogonal to the striped shape of the contact holes 25. The portion G corresponds to the protruding portion that extends along the direction that is orthogonal to the striped shape of the contact holes 25. Further, by the portion G, the interlayer insulating film 11 is connected to the interlayer insulating film 11 that covers the gate electrode 10 of another trench 18. The portion G is provided in a region that opposes the source electrode 13 where the solder 17 and the plating film 16 are provided. FIG. 16 is a perspective view of a portion the interlayer insulating film 11 having the portion G that extends along the direction that is orthogonal to the striped shape of the contact holes 25.

Here, FIG. 16 depicts a portion of the structure of the silicon carbide semiconductor device before the source electrode pad 15 is formed. As depicted in FIG. 16, in a region where the portion G of the interlayer insulating film 11 is provided, the source electrode 13 is not provided. Therefore, the interlayer insulating film 11 does not have to be removed to electrically connect the source electrode 13 and the source electrode pad 15.

Thus, as depicted in FIG. 15, in the regions where the portion G of the interlayer insulating film 11 is provided, unevenness of a surface of the interlayer insulating film 11 provided on the gate electrode 10 is eliminated, i.e., the surface on the side of the interlayer insulating film 11 facing toward the source electrode pad 15. As a result, regions where the portion G of the interlayer insulating film 11 is provided have the structure in which the groove B of the top of the source electrode pad 15 is filled.

In this manner, in the regions where the portion G of the interlayer insulating film 11 is provided, the groove B of the top of the source electrode pad 15 is filled and therefore, similarly to the first embodiment, the solder 17 is inhibited from flowing along the grooves B of the top of the source electrode pad 15. Therefore, similarly to the first embodiment, the solder 17 may be prevented from entering the interior of the silicon carbide semiconductor device.

Here, the portion G is disposed in plural and provided that the flow of the solder 17 is distributed, the disposal positions may be at regular intervals or irregular intervals. For example, the portion G may be disposed forming a ladder shape, a cross-coupling shape, a quadrangle, etc. However, for efficient distribution of the flow of the solder 17, the solder 17 may be caused to flow in a radiating shape. Therefore, the portion G may be disposed to form a hexagonal shape as viewed from above. Further, similarly to the first embodiment, when the portion G is disposed forming a hexagonal shape, the portion G may be further disposed at a position at a center of the hexagonal shape.

A method of manufacturing the silicon carbide semiconductor device according to the second embodiment will be described. First, similarly to the first embodiment, the processes from the process of forming the n-type silicon carbide epitaxial layer 2 to the process of forming the trenches 18 are sequentially performed.

Next, along the surfaces of the n+-type source regions 7 and the p++-type contact regions 8 as well as along the bottom and the side walls of each trench 18, the gate insulating film 9 is formed. The gate insulating film 9 may be formed by thermal oxidation by a heat treatment of a temperature of about 1000 degrees C. under an oxygen atmosphere. Further, the gate insulating film 9 may be formed by a deposition method by a chemical reaction such as for a high temperature oxide (HTO).

Next, on the gate insulating film 9, a polycrystalline silicon layer doped with, for example, phosphorus atoms is provided. The polycrystalline silicon layer may be formed so as to be embedded in the trenches 18. The polycrystalline silicon layer is patterned by photolithography to remain in the trenches 18, thereby forming the gate electrodes 10. A portion of the gate electrodes 10 may protrude outside the trenches 18.

Next, for example, phosphate glass is deposited so as to have a thickness of about 1 μm and to cover the gate insulating film 9 and the gate electrodes 10, thereby forming the interlayer insulating film 11. Next, a barrier metal (not depicted) containing titanium (Ti) or titanium nitride (TiN) may be formed so as to cover the interlayer insulating film 11. The interlayer insulating film 11 and the gate insulating film 9 are patterned by photolithography, thereby forming contact holes 25 that expose the n+-type source regions 7 and the p++-type contact regions 8. In this patterning, formation is such that in regions that oppose the source electrode pad 15 where the solder 17 and the plating films 16 are provided, the interlayer insulating films 11 that are formed extend along the direction that is orthogonal to the striped shape so as to be connected to each other. Thereafter, a heat treatment process (reflow) is performed, thereby planarizing the interlayer insulating film 11.

Thereafter, similarly to the first embodiment, the processes from the process of patterning so that the source electrode 13 remains in the contact holes 25 to the process of forming the pin electrodes 19 at the plating films 16 via the solder 17 are performed sequentially. Thus, as described above, the silicon carbide semiconductor device depicted in FIG. 15 is completed.

As described, according to the silicon carbide semiconductor device of the second embodiment, the interlayer insulating films have a protruding portion that extends along the direction that is orthogonal to the striped shape of the contact holes 25. As a result of this portion, the second embodiment has effects similar to those of the first embodiment.

Figure 17:
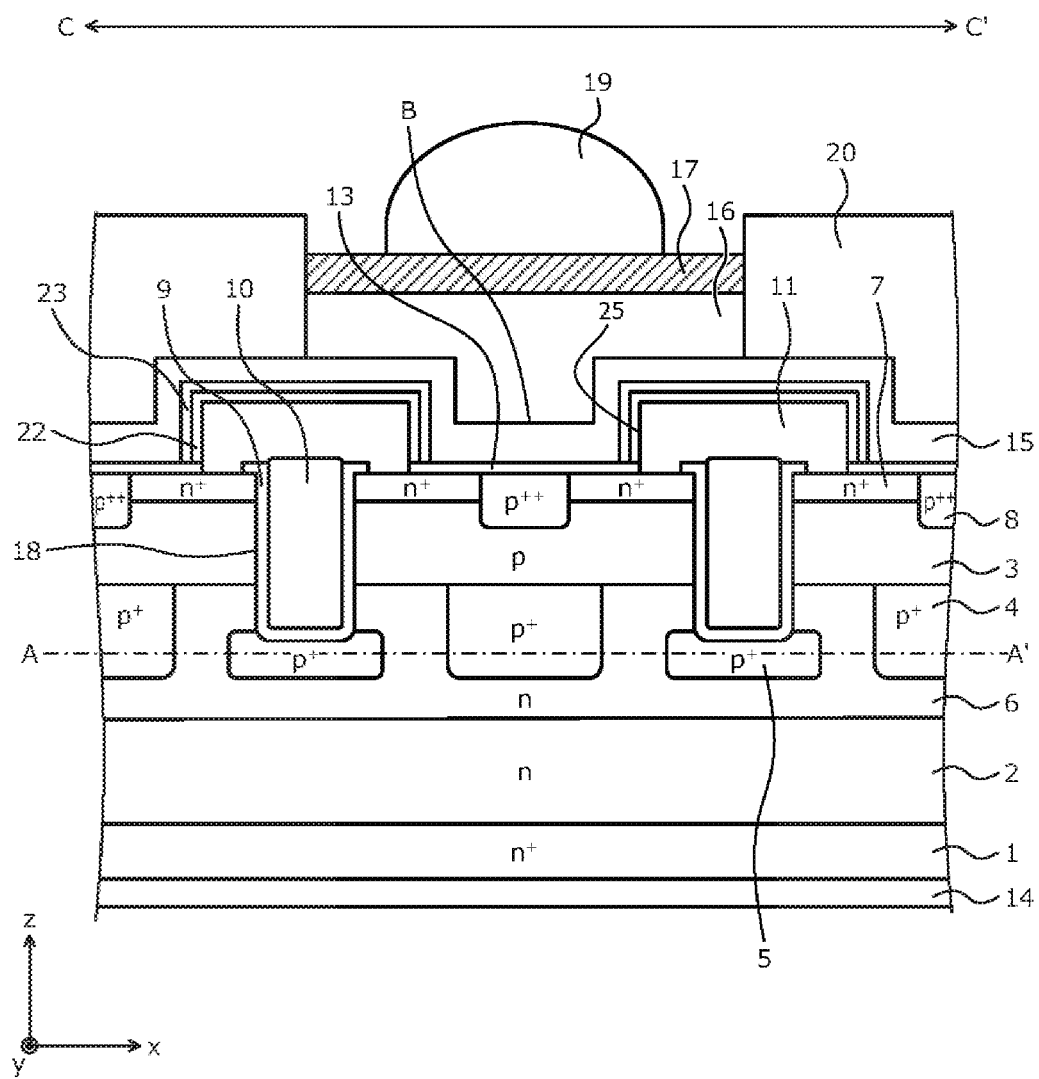
FIG. 17 is a cross-sectional view of a structure of a portion of the silicon carbide semiconductor device according to a third embodiment, along cutting line C-C' in FIG. 19.
Figure 18:
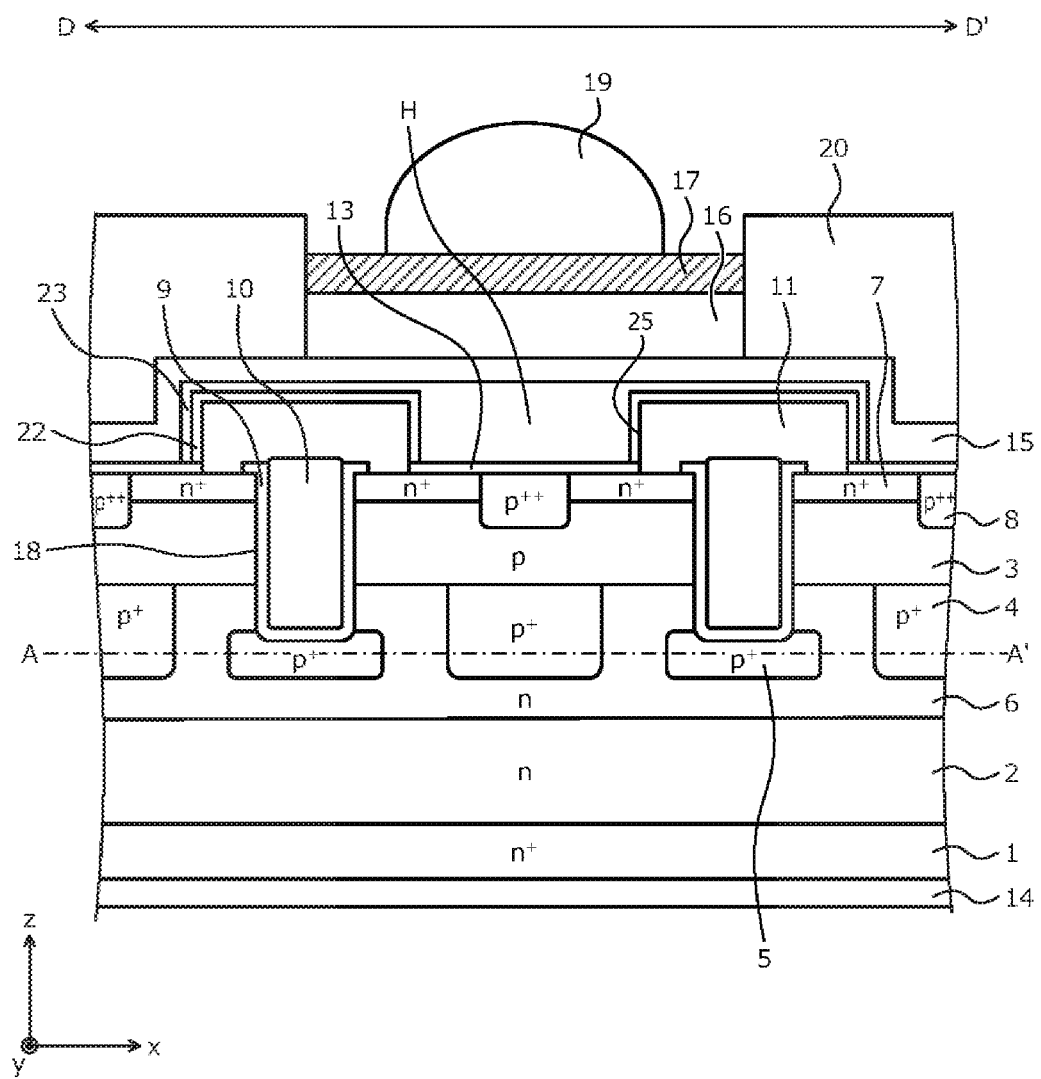
FIG. 18 is a cross-sectional view of a structure of a portion of the silicon carbide semiconductor device according to the third embodiment, along cutting line D-D' in FIG. 19.
Figure 19:
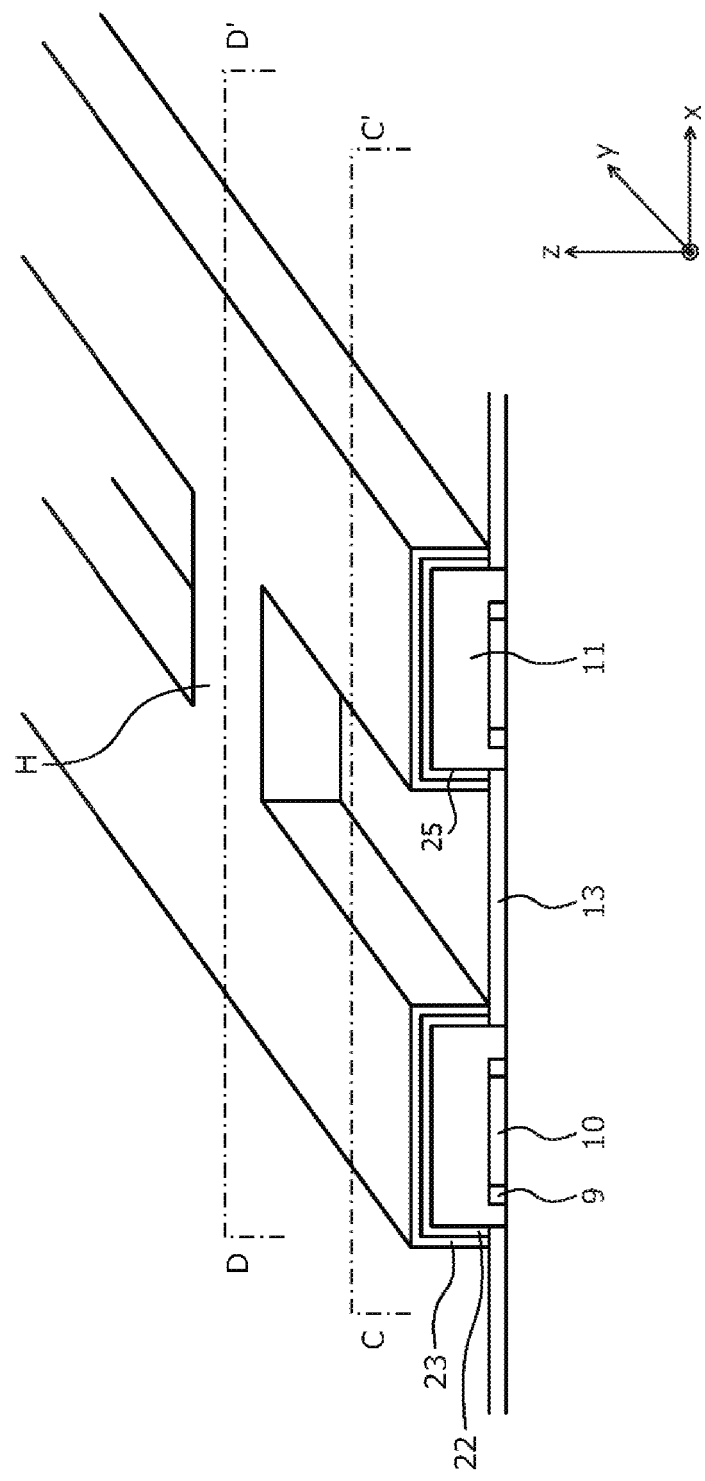
FIG. 19 is a perspective view of a portion of the structure of the silicon carbide semiconductor device according to the third embodiment.

FIG. 17 is a cross-sectional view of a structure of a portion of the silicon carbide semiconductor device according to a third embodiment, along cutting line C-C' in FIG. 19. FIG. 18 is a cross-sectional view of a structure of a portion of the silicon carbide semiconductor device according to the third embodiment, along cutting line D-D' in FIG. 19. Further, FIG. 19 is a perspective view of a portion of the structure of the silicon carbide semiconductor device according to the third embodiment.

The silicon carbide semiconductor device according to the third embodiment differs from the silicon carbide semiconductor device according to the first embodiment in that a barrier metal in which a Ti film 22 and a TiN film 23 are sequentially stacked is provided so as to cover the interlayer insulating film 11, and the TiN film 23 has a portion H that extends in the direction that is orthogonal to the striped shape of the contact holes 25. The portion H corresponds to the protruding portion that extends in the direction that is orthogonal to the striped shape of the contact holes 25. Further, by the portion H, the TiN film 23 is connected to the TiN film 23 that covers the interlayer insulating film 11 of another trench 18. The portion H is provided in a region that opposes the source electrode 13 where the solder 17 and the plating film 16 are provided.

FIG. 17 is a cross-sectional view of a portion where the TiN film 23 does not have the portion H that extends in the direction that is orthogonal to the striped shape of the contact holes 25. FIG. 18 is a cross-sectional view of a portion where the TiN film 23 has the portion H that extends along the direction that is orthogonal to the striped shape of the contact holes 25.

FIG. 19 depicts a portion of a structure of the silicon carbide semiconductor device before the source electrode pad 15 is formed. As depicted in FIG. 19, in a region where the portion H of the TiN film 23 is provided, a top of the source electrode 13 is covered by the TiN film 23. As a result, as depicted in FIG. 18, in region where the portion H of the TiN film 23 is provided, a structure is created in which the groove B of the top of the source electrode pad 15 is filled.

In this manner, in a region where the portion H of the TiN film 23 is provided, the groove B of the top of the source electrode pad 15 is filled and therefore, similarly to the first embodiment, the solder 17 is inhibited from flowing along the groove B at the top of the source electrode pad 15. Therefore, similarly to the first embodiment, the solder 17 is prevented from entering the interior of the silicon carbide semiconductor device.

Here, the portion H is provided in plural and provided that the flow of the solder 17 is distributed, the disposal positions may be at regular intervals or irregular intervals. For example, the portion H may be disposed to form a ladder shape, a cross-coupling shape, a quadrangle, etc. However, for efficient distribution of the flow of the solder 17, the solder 17 may be caused to flow in a radiating shape. Therefore, the portion H may be disposed to form a hexagonal shape as viewed from above. Further, similarly to the first embodiment, when the portion H is disposed to form a hexagonal shape, the portion H may be further disposed at a position at a center of the hexagonal shape.

A method of manufacturing the silicon carbide semiconductor device according to the third embodiment will be described. First, similarly to the first embodiment, the processes from the process of forming the n-type silicon carbide epitaxial layer 2 to the process of forming the gate insulating film 9 are sequentially performed.

Next, on the gate insulating film 9, a polycrystalline silicon layer doped with, for example, phosphorus atoms is provided. The polycrystalline silicon layer may be formed so as to be embedded in the trenches 18. The polycrystalline silicon layer is patterned by photolithography to remain in the trenches 18, thereby providing the gate electrodes 10. A portion of the gate electrodes 10 may protrude outside the trenches 18.

Next, for example, phosphate glass is deposited so as to cover the gate insulating film 9 and the gate electrodes 10 and to have a thickness of about 1 μm, thereby forming the interlayer insulating film 11. Next, the Ti film 22 and the TiN film 23 are sequentially stacked so as to cover the interlayer insulating film 11, thereby forming the barrier metal. The interlayer insulating film 11, the gate insulating film 9, and the barrier metal are patterned by photolithography, thereby forming contact holes 25 that expose the $n^+$-type source regions 7 and the $p^{++}$-type contact regions 8. In this patterning, formation is such that in regions that oppose the source electrode pad 15 where the solder 17 and the plating film 16 are provided, the TiN film 23 is continuous, extending along the direction that is orthogonal to the striped shape. Thereafter, a heat treatment (reflow) is performed, thereby planarizing the interlayer insulating film 11.

Thereafter, similarly to the first embodiment, the processes from the process of patterning so that the source electrode 13 remains in the contact holes 25 to the process of forming the pin electrodes 19 at the plating films 16 via the solder 17 are performed sequentially. Thus, as described above, the silicon carbide semiconductor device depicted in FIGS. 17 and 18 is completed.

As described, according to the silicon carbide semiconductor device of the third embodiment, the TiN film has a protruding portion that extends along the direction that is orthogonal to the striped shape of the contact holes 25. As a result of this portion, the third embodiment has effects similar to those of the first embodiment.

Figure 20:
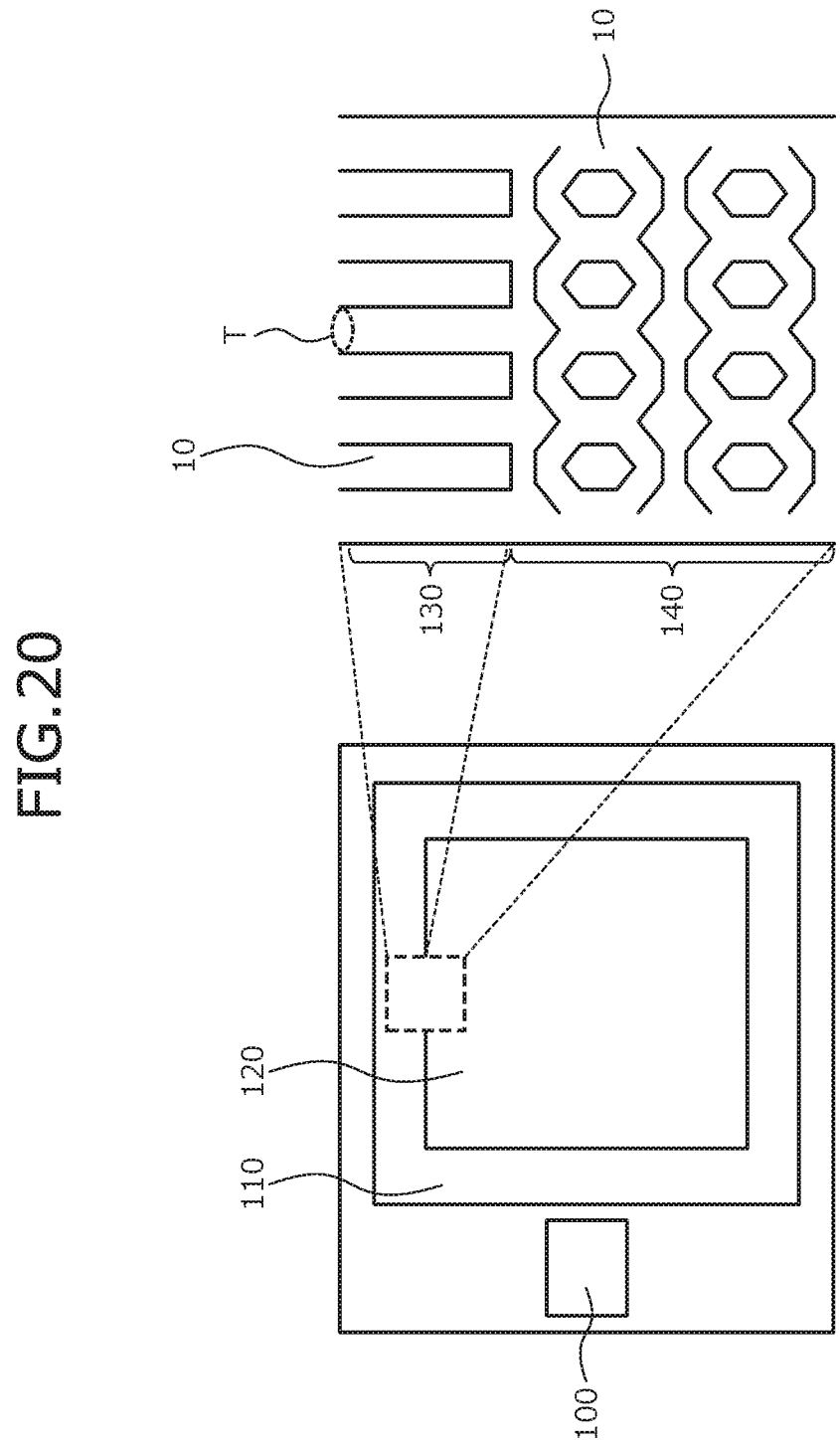
FIG. 20 is a top view of a structure of the silicon carbide semiconductor device according to a fourth embodiment.
Figure 21:
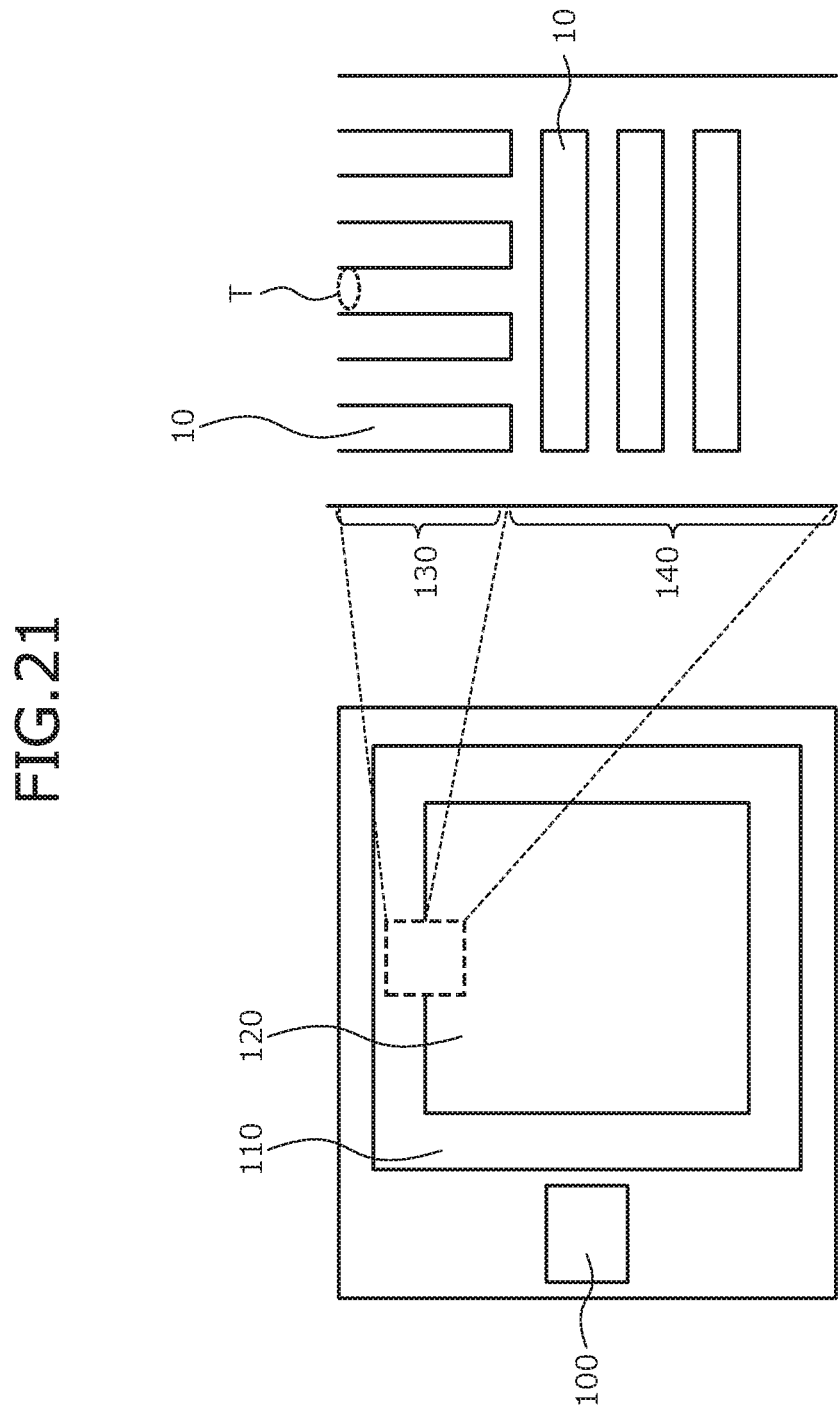
FIG. 21 is a top view of another structure of the silicon carbide semiconductor device according to the fourth embodiment.
Figure 22:
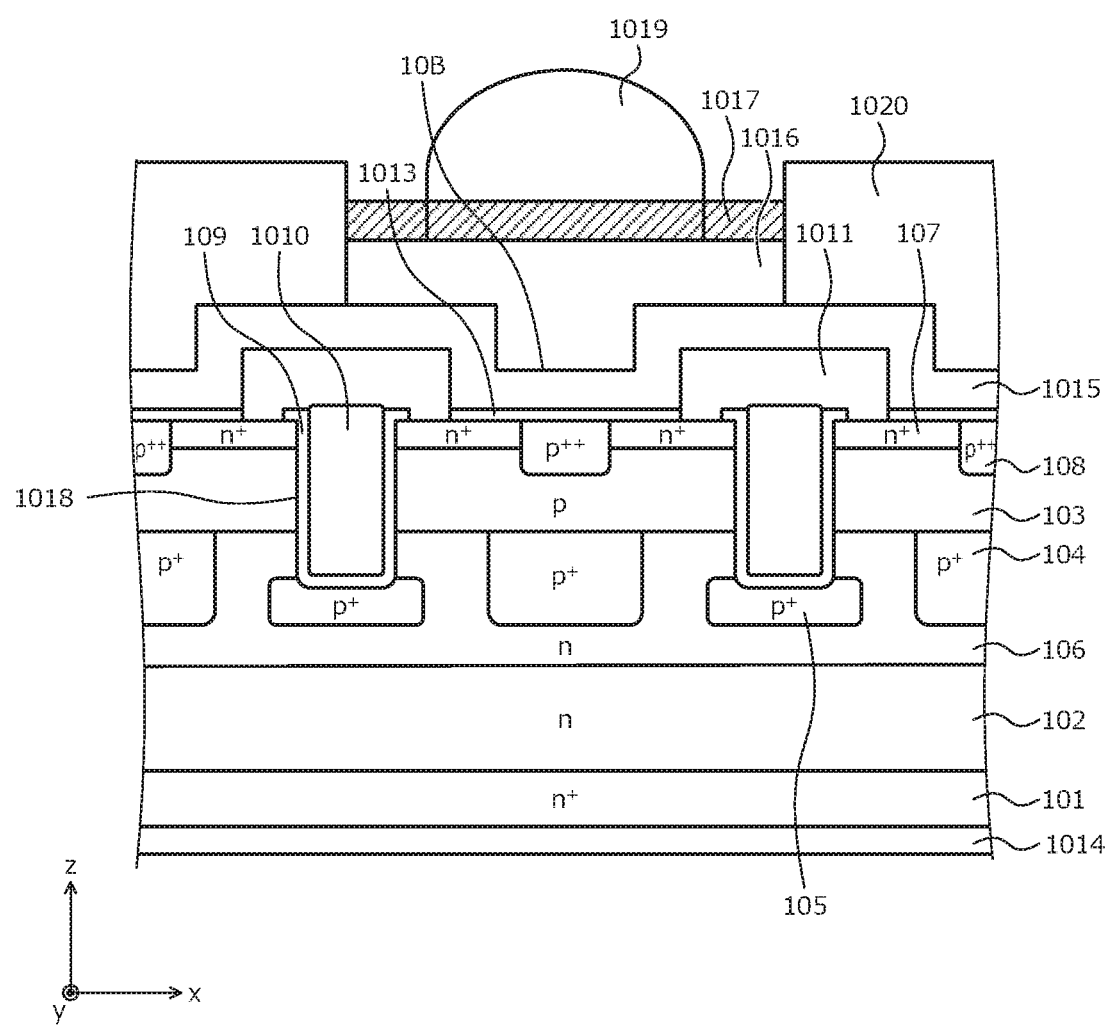
FIG. 22 is a cross-sectional view of a structure of a conventional silicon carbide semiconductor device.

FIG. 20 is a top view of a structure of the silicon carbide semiconductor device according to a fourth embodiment. Further, FIG. 21 is a top view of another structure of the silicon carbide semiconductor device according to the fourth embodiment. In FIGS. 20 and 21, the right-hand side depicts an enlarged view of a region encompassed by a dashed-lined line. A cross-sectional view of the structure of the silicon carbide semiconductor device according to the fourth embodiment is similar to that of the conventional silicon carbide semiconductor device (refer to FIG. 22) and therefore, description is omitted hereinafter.

The silicon carbide semiconductor device according to the fourth embodiment differs from the conventional silicon carbide semiconductor device in that the gate electrode 10 has a structure that in a source pad region 110, differs in a region 130 in which a plating region 120 is not provided and in a region 140 in which the plating region 120 is provided.

For example, as depicted in FIG. 20, in the region 130, the gate electrode 10 has a striped shape while in the region 140, the structure of the gate electrode 10 has a polygonal shape (hexagon in FIG. 20). Further, as depicted in FIG. 21, the striped shape of the gate electrode 10 in the region 130 and the striped shape of the gate electrode 10 in the region 140 have differing longitudinal directions.

In the fourth embodiment, the structure of the gate electrode 10 in the region 130 and the structure of the gate electrode 10 in the region 140 differ from each other and therefore, the structures of the grooves B on the top of the source electrode pad 15 also differ between the gate electrodes 10. Therefore, the solder 17 that flows along the groove B on the top of the source electrode pad 15 and reaches the end portion T of the groove B is reduced. For example, in the case of the polygonal shape depicted in FIG. 20, when the flow of the solder 17 is distributed and the longitudinal direction in FIG. 21 differs, the solder 17 flows in a direction that is different from a direction toward the end portion T, whereby the solder 17 that reaches the end portion T decreases. Therefore, the pushing force of the solder 17 decreases, thereby enabling the solder 17 to be prevented from entering the interior of the silicon carbide semiconductor device.

A method of manufacturing the silicon carbide semiconductor device according to the fourth embodiment will be described. First, similarly to the first embodiment, the processes from the process of forming the n-type silicon carbide epitaxial layer 2 to the process of carrying out the activation process for the first p$^+$-type base regions 4, the second p$^+$-type base regions 5, the n$^+$-type source regions 7, and the p$^{++}$-type contact regions 8 are sequentially performed.

Next, on the surface of the p-type silicon carbide epitaxial layer 3, a trench formation mask having predetermined openings formed by photolithography is formed using, for example, an oxide film. The trench formation mask is formed so that the structure of the trench in the region 130 in which no plating region is provided in the source pad region and the structure of the trench in the region 140 in which the plating region is provided in the source pad region differ from each other. Next, the trenches 18 are formed by dry etching to penetrate the p-type silicon carbide epitaxial layer 3 and reach the n-type silicon carbide epitaxial layer 2. The bottoms of the trenches 18 may reach the first p$^+$-type base regions 4 formed in the n-type silicon carbide epitaxial layer 2. Next, the trench formation mask is removed.

Next, the gate insulating film 9 is formed along the surfaces of the n$^+$-type source regions 7 and the p$^{++}$-type contact regions 8 as well as along the bottoms and side walls of the trenches 18. The gate insulating film 9 may be formed by thermal oxidation by a heat treatment at a temperature of about 1000 degrees C. under an oxygen atmosphere. Further, the gate insulating film 9 may be formed by a deposition method by a chemical reaction such as that for a high temperature oxide (HTO).

Next, on the gate insulating film 9, a polycrystalline silicon layer doped with, for example, phosphorus atoms is provided. The polycrystalline silicon layer may be formed so as to be embedded in the trenches 18. The polycrystalline silicon layer is patterned by photolithography to remain in the trenches 18, whereby the gate electrodes 10 are provided. A portion of the gate electrode 10 may protrude outside the trench 18. The trench structure in the region 130 and the trench structure in the region 140 differ from each other and therefore, a structure of the gate electrode 10 in the region 130 and a structure of the gate electrode 10 in the region 140 are formed to differ from each other.

Thereafter, similarly to the first embodiment, the processes from the process of forming the interlayer insulating film 11 to the process of forming the pin electrodes 19 at the plating films 16 via the solder 17 are performed. Thus, as described, the silicon carbide semiconductor device depicted in FIGS. 20 and 21 is completed.

As described, according to the silicon carbide semiconductor device of the fourth embodiment, in a region in the source pad region and in which the plating region is not provided, and a region in the source pad region and in which the plating region is provided, the structures of the gate electrodes differ. As a result, the structures of the grooves on the top of source electrode pad differ between the gate electrodes, whereby the amount of solder that flows along the grooves on the top of the source electrode pad and reaches the end portion of the grooves decreases. As a result, the pushing force of the solder decreases, thereby enabling the solder to be prevented from entering the interior of the silicon carbide semiconductor device.

In the embodiments of the present invention, while an instance has been described in which a main surface of the silicon carbide substrate containing silicon carbide is assumed to be a (0001) plane and a MOS is configured on the (0001) plane as an example, without limitation hereto, various modifications such as in the wide bandgap semiconductor, plane orientation of the main surface of the substrate, etc. are possible.

Further, in the embodiments of the present invention, while a trench MOSFET is described as an example, without limitation hereto, application is possible to semiconductor devices of various types of configurations such a planar MOSFET having a striped shape gate electrode, a MOS type semiconductor device such an IGBT, etc. Further, in the embodiments described, while an instance in which silicon carbide is used as the wide bandgap semiconductor is described as an example, similar effects are obtained even in cases in which a wide bandgap semiconductor other than silicon carbide such as gallium nitride (GaN) is used. In the embodiments, while the first conductivity type is assumed to be an n-type and the second conductivity type is assumed to be a p-type, the present invention is similarly implemented when the first conductivity type is a p-type and the second conductivity type is an n-type.

According to the present invention, a gate electrode has a portion that extends along a direction that is orthogonal to the striped shape. Grooves are embedded in the top of the source electrode pad and the solder is prevented from flowing along the grooves of the top of the source electrode pad by this portion. As a result, the amount of solder that reaches the end portion of the grooves decreases, thereby reducing the pushing force of the solder, whereby the solder may be prevented from entering the interior of the silicon carbide semiconductor device. Therefore, characteristics of the silicon carbide semiconductor device do not degrade and the reliability of the silicon carbide semiconductor device does not decrease.

The silicon carbide semiconductor device and the method of manufacturing a silicon carbide semiconductor device according to the present invention achieve an effect in that solder is prevented from reaching the surface of the silicon carbide base, characteristics do not degrade and reliability does not decrease.

As described, the silicon carbide semiconductor device and the method of manufacturing a silicon carbide semiconductor device according to the present invention are used for high-voltage semiconductor devices used in power converting equipment and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a semiconductor substrate of a first conductivity type;
a first semiconductor layer of the first conductivity type provided on a front surface of the semiconductor substrate and having a first side, and a second side opposite to the first side and facing the front surface of the semiconductor substrate, the first semiconductor layer having an impurity concentration lower than an impurity concentration of the semiconductor substrate;
a second semiconductor layer of a second conductivity type selectively provided at a surface of the first side of the first semiconductor layer, the second semiconductor layer having a first side, and a second side opposite to the first side and facing the first side of the first semiconductor layer;
a first semiconductor region of the first conductivity type selectively provided in a surface layer of the first side of the second semiconductor layer;
a gate electrode including a first portion provided in a plurality of trenches via gate insulating films, the trenches being provided at the first side of the second semiconductor layer;
a protruding portion disposed, on the second semiconductor layer, in a bridge area located between two adjacent ones of the trenches in a direction orthogonal to the trenches;
an interlayer insulating film provided on the gate electrode, and having a plurality of contact holes, the contact holes forming a striped pattern and each exposing a part of the second semiconductor layer and a part of the first semiconductor region;
a first electrode provided on the interlayer insulating film and in the contact holes;
a plating film provided in a plating area on the first electrode;
a solder on the plating film; and
a second electrode provided on a rear surface of the semiconductor substrate, wherein
the protruding portion includes a part of the interlayer insulating film disposed in the bridged area.

2. The silicon carbide semiconductor device according to claim 1, wherein
the gate electrode includes a second portion disposed in the bridged area on the second semiconductor layer, and
the protruding portion includes the second portion of the gate electrode and a part of the interlayer insulating film disposed on the second portion of the gate electrode.

3. A silicon carbide semiconductor device according to claim 1, comprising:
a semiconductor substrate of a first conductivity type;
a first semiconductor layer of the first conductivity type provided on a front surface of the semiconductor substrate and having a first side, and a second side opposite to the first side and facing the front surface of the semiconductor substrate, the first semiconductor layer having an impurity concentration lower than an impurity concentration of the semiconductor substrate;
a second semiconductor layer of a second conductivity type selectively provided at a surface of the first side of the first semiconductor layer, the second semiconductor layer having a first side, and a second side opposite to the first side and facing the first side of the first semiconductor layer;
a first semiconductor region of the first conductivity type selectively provided in a surface layer of the first side of the second semiconductor layer;
a gate electrode including a first portion provided in a plurality of trenches via gate insulating films, the trenches being provided at the first side of the second semiconductor layer;
a protruding portion disposed, on the second semiconductor layer, in a bridge area located between two adjacent ones of the trenches in a direction orthogonal to the trenches;
an interlayer insulating film provided on the gate electrode, and having a plurality of contact holes, the contact holes forming a striped pattern and each exposing a part of the second semiconductor layer and a part of the first semiconductor region;
a first electrode provided on the interlayer insulating film and in the contact holes;
a plating film provided in a plating area on the first electrode;
a solder on the plating film;
a second electrode provided on a rear surface of the semiconductor substrate; and
a barrier metal provided between the interlayer insulating film and the first electrode, wherein
the protruding portion includes a part of the barrier metal disposed on the interlayer insulating film at the bridge area.

4. A silicon carbide semiconductor device, comprising:
a semiconductor substrate of a first conductivity type;
a first semiconductor layer of the first conductivity type provided on a front surface of the semiconductor substrate and having a first side, and a second side opposite to the first side and facing the front surface of the semiconductor substrate, the first semiconductor layer having an impurity concentration lower than an impurity concentration of the semiconductor substrate;
a second semiconductor layer of a second conductivity type selectively provided at a surface of the first side of the first semiconductor layer, the second semiconductor layer having a first side, and a second side opposite to the first side and facing the first side of the first semiconductor layer;
a first semiconductor region of the first conductivity type selectively provided in a surface layer of the first side of the second semiconductor layer;
a gate electrode including a first portion provided in a plurality of trenches via gate insulating films, the trenches being provided at the first side of the second semiconductor layer;

a protruding portion disposed, on the second semiconductor layer, in a bridge area located between two adjacent ones of the trenches in a direction orthogonal to the trenches;

an interlayer insulating film provided on the gate electrode, and having a plurality of contact holes, the contact holes forming a striped pattern and each exposing a part of the second semiconductor layer and a part of the first semiconductor region;

a first electrode provided on the interlayer insulating film and in the contact holes;

a plating film provided in a plating area on the first electrode;

a solder on the plating film; and a second electrode provided on a rear surface of the semiconductor substrate, wherein an area on the interlayer insulating film corresponding to the plating area is free of the contact holes.

5. The silicon carbide semiconductor device according to claim 1, wherein the protruding portion includes a plurality of hexagonal shapes, as viewed from the front surface of the semiconductor substrate.

6. The silicon carbide semiconductor device according to claim 1, wherein the gate electrode has one striped shape in an area other than the plating area, and in the plating area, has either an other striped shape having stripes extending in a direction different from a direction of stripes of the one striped shape, or has a polygonal shape.

7. The silicon carbide semiconductor device according claim 1, wherein each of the trenches penetrates the second semiconductor layer and reaches the first semiconductor layer.

* * * * *